United States Patent
Chang et al.

(10) Patent No.: US 8,900,959 B2
(45) Date of Patent: Dec. 2, 2014

(54) NON-REPLACEMENT GATE NANOMESH FIELD EFFECT TRANSISTOR WITH PAD REGIONS

(71) Applicant: International Business Machines Corporation, Armonk, NY (US)

(72) Inventors: Josephine B. Chang, Mahopac, NY (US); Paul Chang, Mahopac, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 13/796,278

(22) Filed: Mar. 12, 2013

(65) Prior Publication Data

US 2014/0264276 A1 Sep. 18, 2014

(51) Int. Cl.
| | |
|---|---|
| *H01L 21/336* | (2006.01) |
| *H01L 21/20* | (2006.01) |
| *H01L 29/745* | (2006.01) |
| *H01L 29/76* | (2006.01) |
| *H01L 29/775* | (2006.01) |
| *H01L 29/66* | (2006.01) |

(52) U.S. Cl.
CPC ........ *H01L 29/775* (2013.01); *H01L 29/66439* (2013.01)
USPC ........... 438/300; 438/303; 438/479; 257/213; 257/224; 257/288

(58) Field of Classification Search
USPC .......... 438/279, 300, 303, 479; 257/213, 217, 257/224, 229, 243, 288
See application file for complete search history.

(56) References Cited

U.S. PATENT DOCUMENTS

| | | | |
|---|---|---|---|
| 8,183,104 B2 | 5/2012 | Hobbs et al. | |
| 8,242,485 B2 * | 8/2012 | Chang et al. | 257/24 |
| 2011/0278544 A1 | 11/2011 | Bangsaruntip et al. | |
| 2012/0007051 A1 | 1/2012 | Bangsaruntip et al. | |
| 2012/0138886 A1 | 6/2012 | Kuhn et al. | |
| 2012/0145650 A1 | 6/2012 | Anderson et al. | |
| 2012/0146000 A1 | 6/2012 | Bangsaruntip et al. | |
| 2012/0225525 A1 | 9/2012 | Bangsaruntip et al. | |
| 2012/0256242 A1 | 10/2012 | Chang et al. | |

* cited by examiner

*Primary Examiner* — Hsien Ming Lee
(74) *Attorney, Agent, or Firm* — Scully, Scott, Murphy & Presser, P.C.; Louis J. Percello, Esq.

(57) ABSTRACT

A gate-first processing scheme for forming a nanomesh field effect transistor is provided. An alternating stack of two different semiconductor materials is patterned to include two pad regions and nanowire regions. A semiconductor material is laterally etched selective to another semiconductor material to form a nanomesh including suspended semiconductor nanowires. A stack of a gate dielectric, a gate electrode, and a gate cap dielectric is formed over the nanomesh. A dielectric spacer is formed around the gate electrode. An isotropic etch is employed to remove dielectric materials that are formed in lateral recesses of the patterned alternating stack. A selective epitaxy process can be employed to form a source region and a drain region.

15 Claims, 31 Drawing Sheets

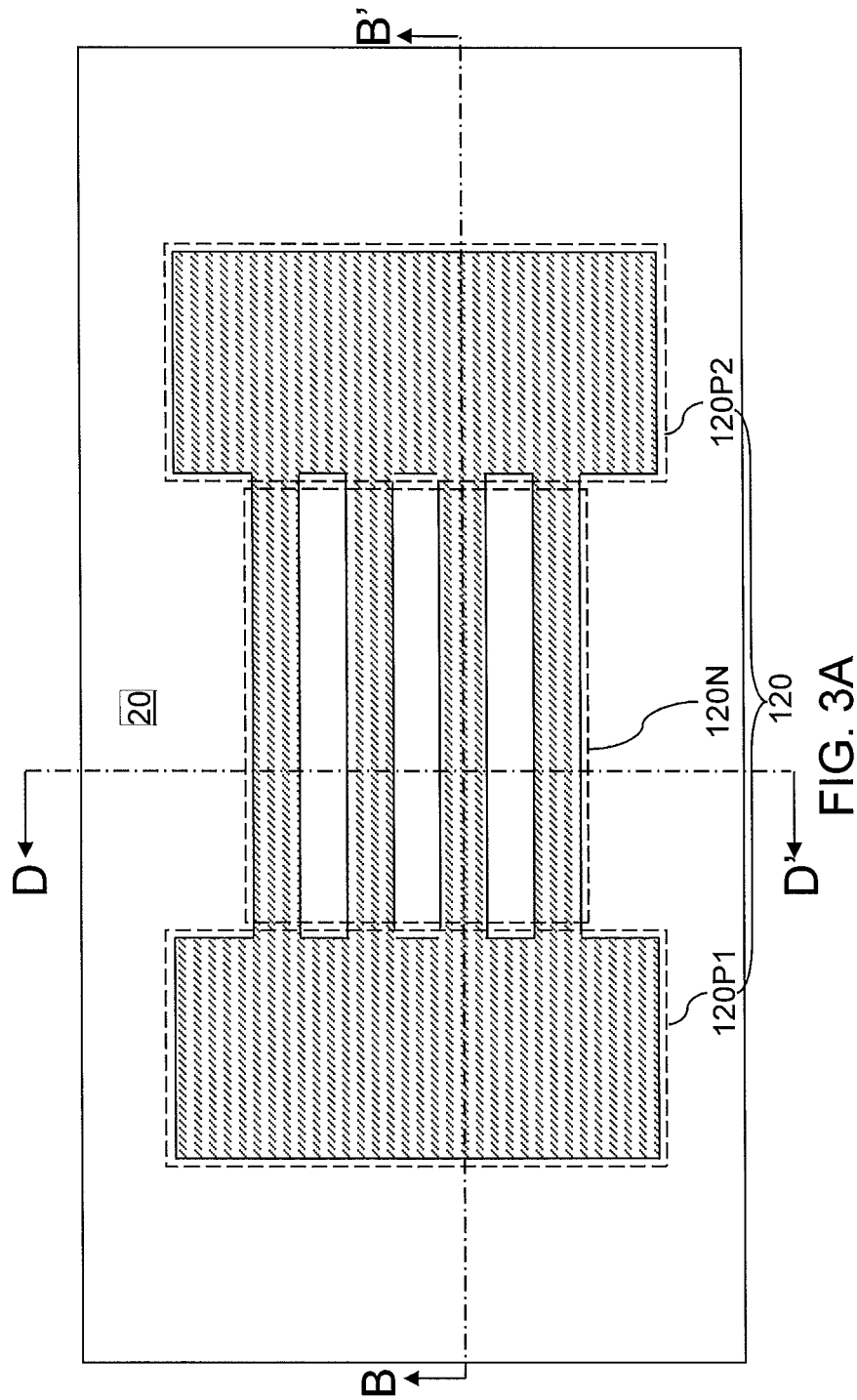

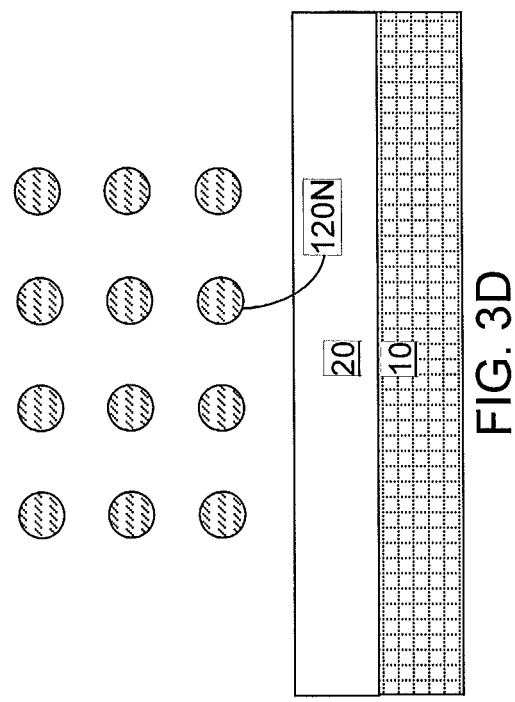

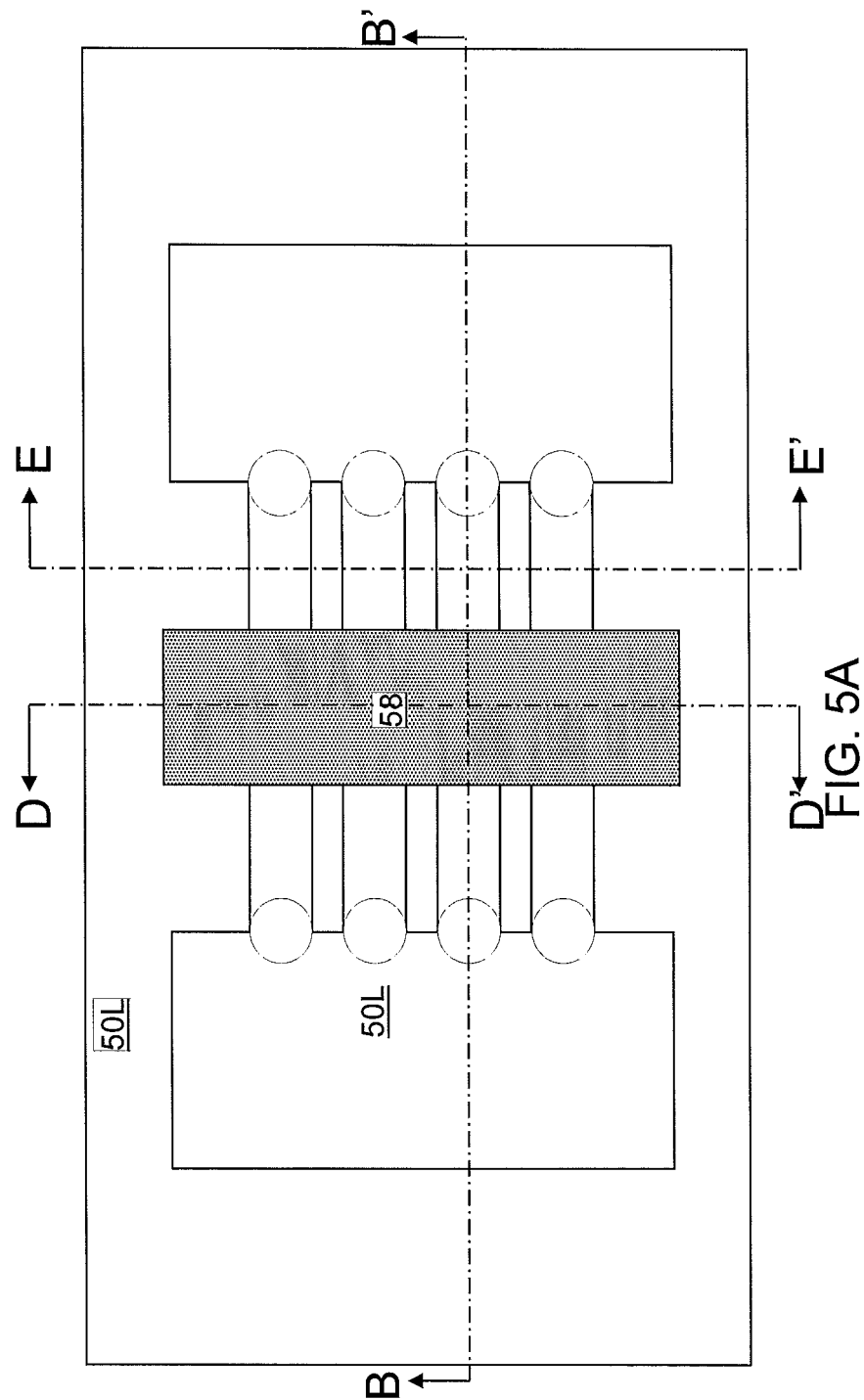

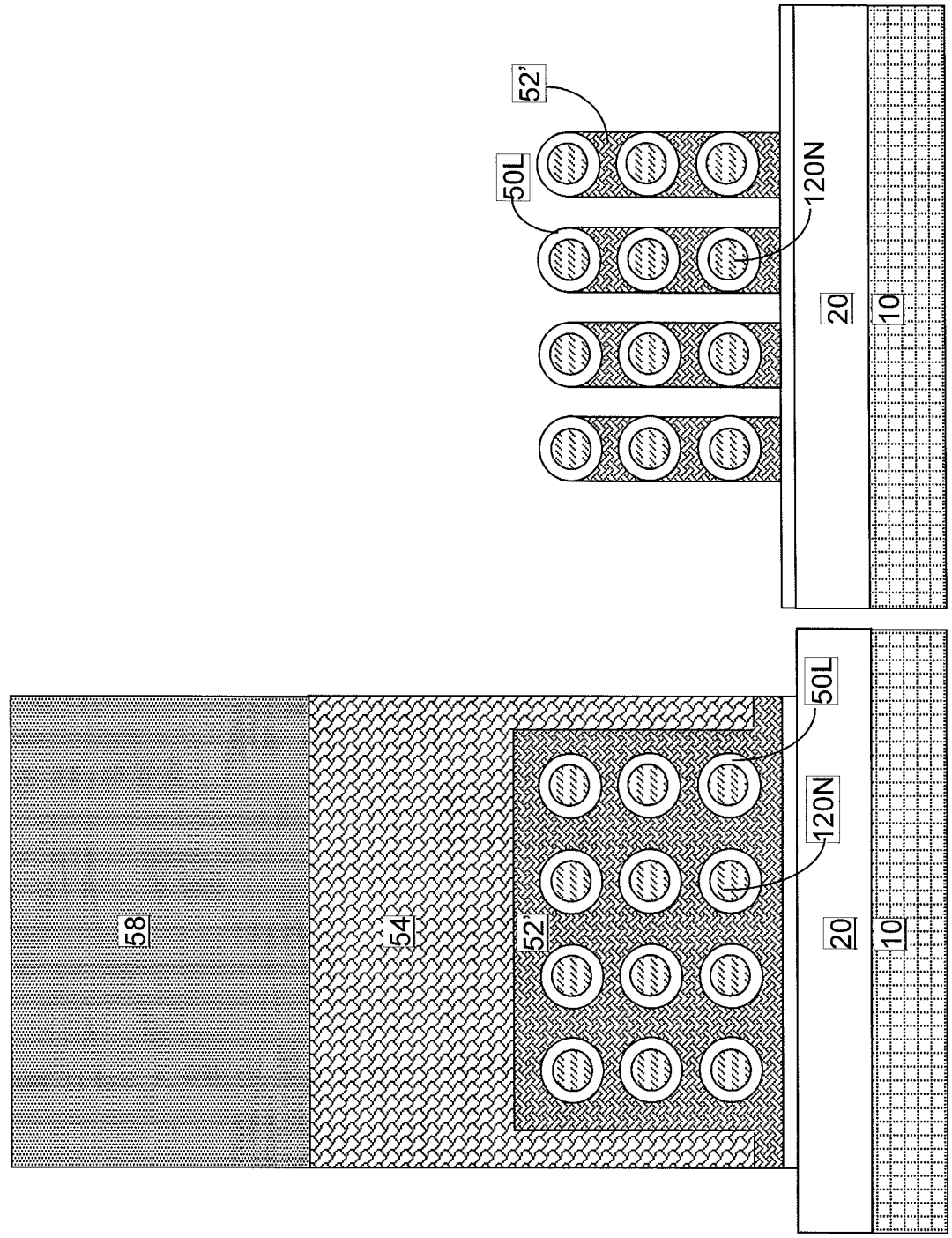

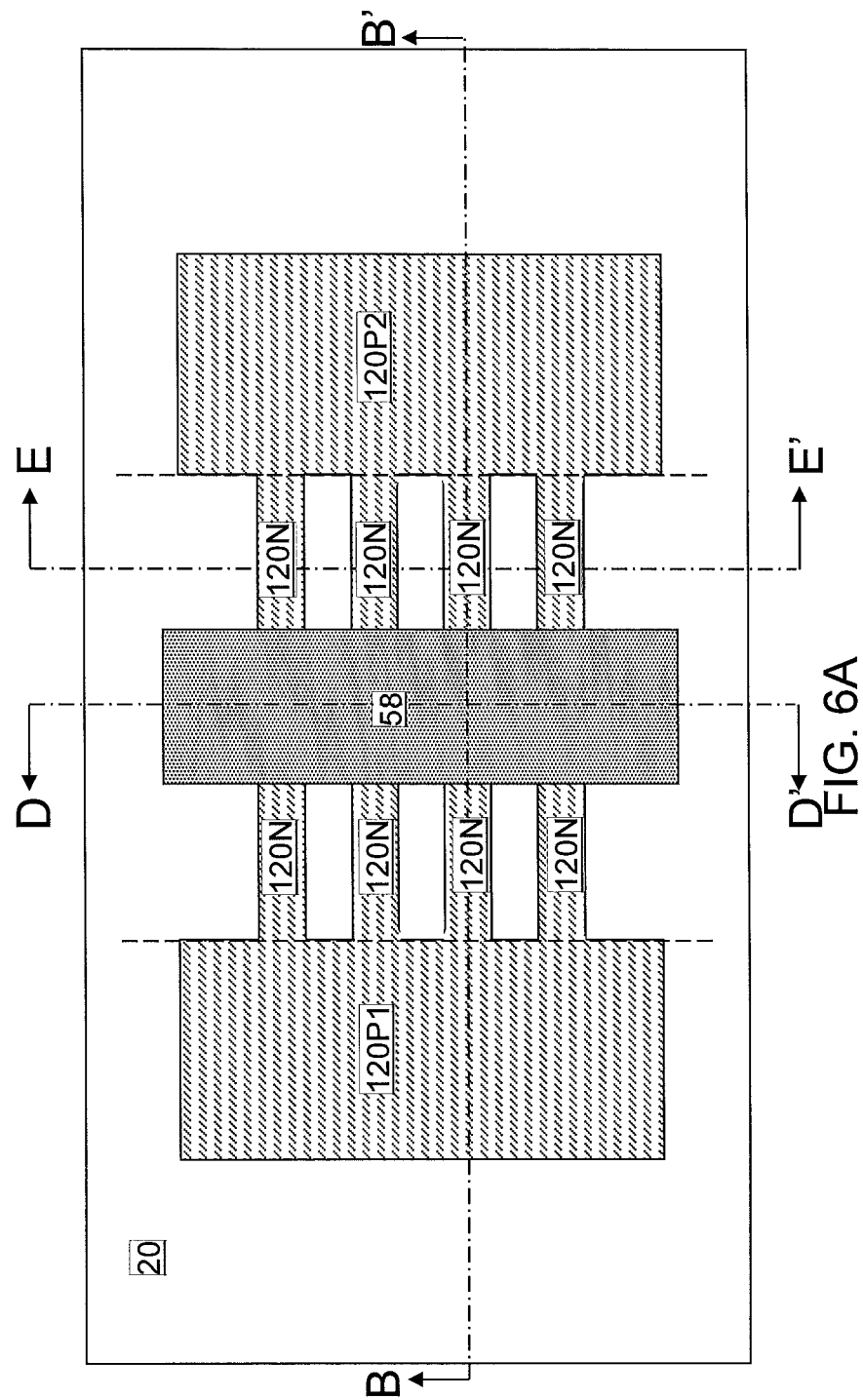

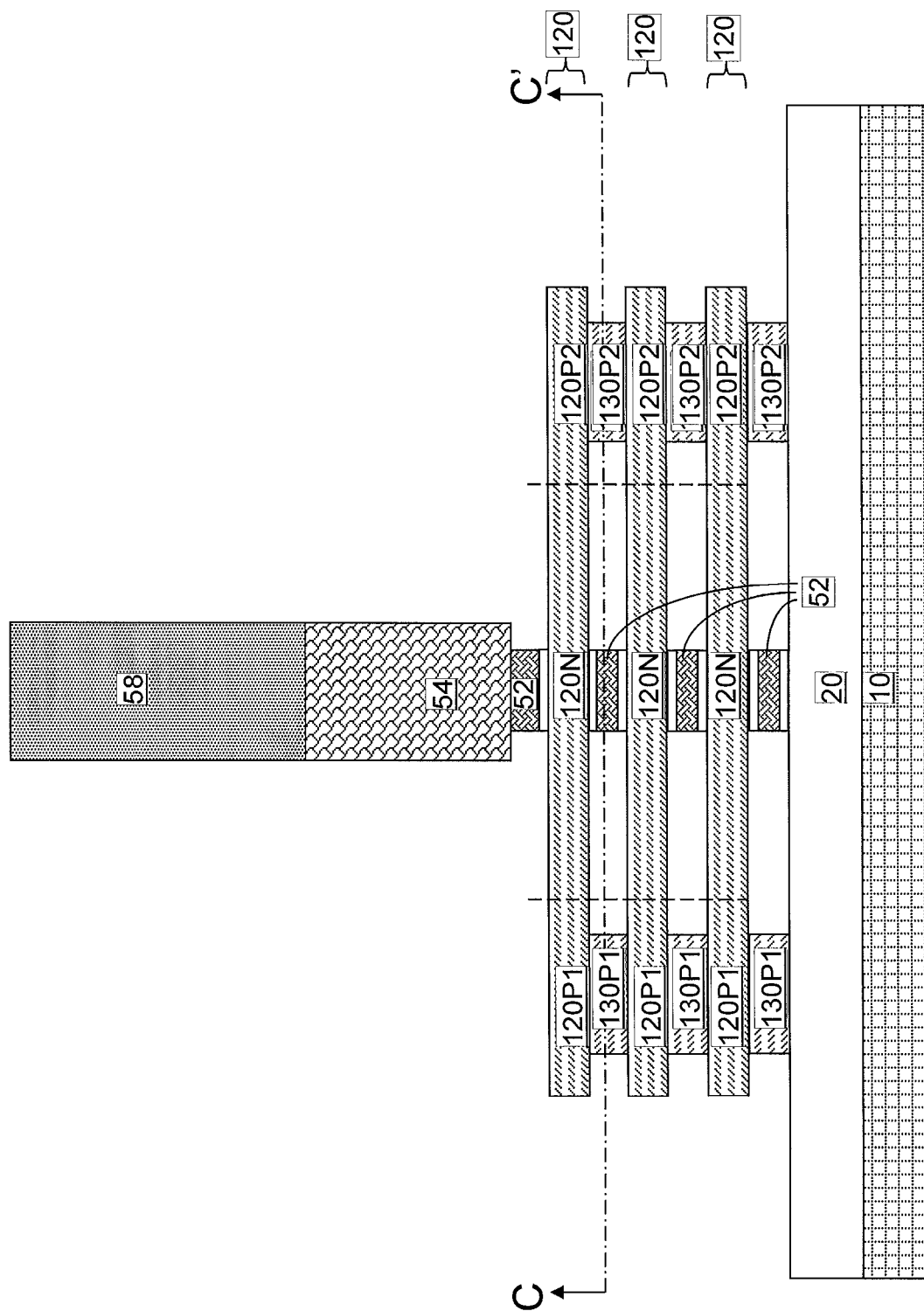

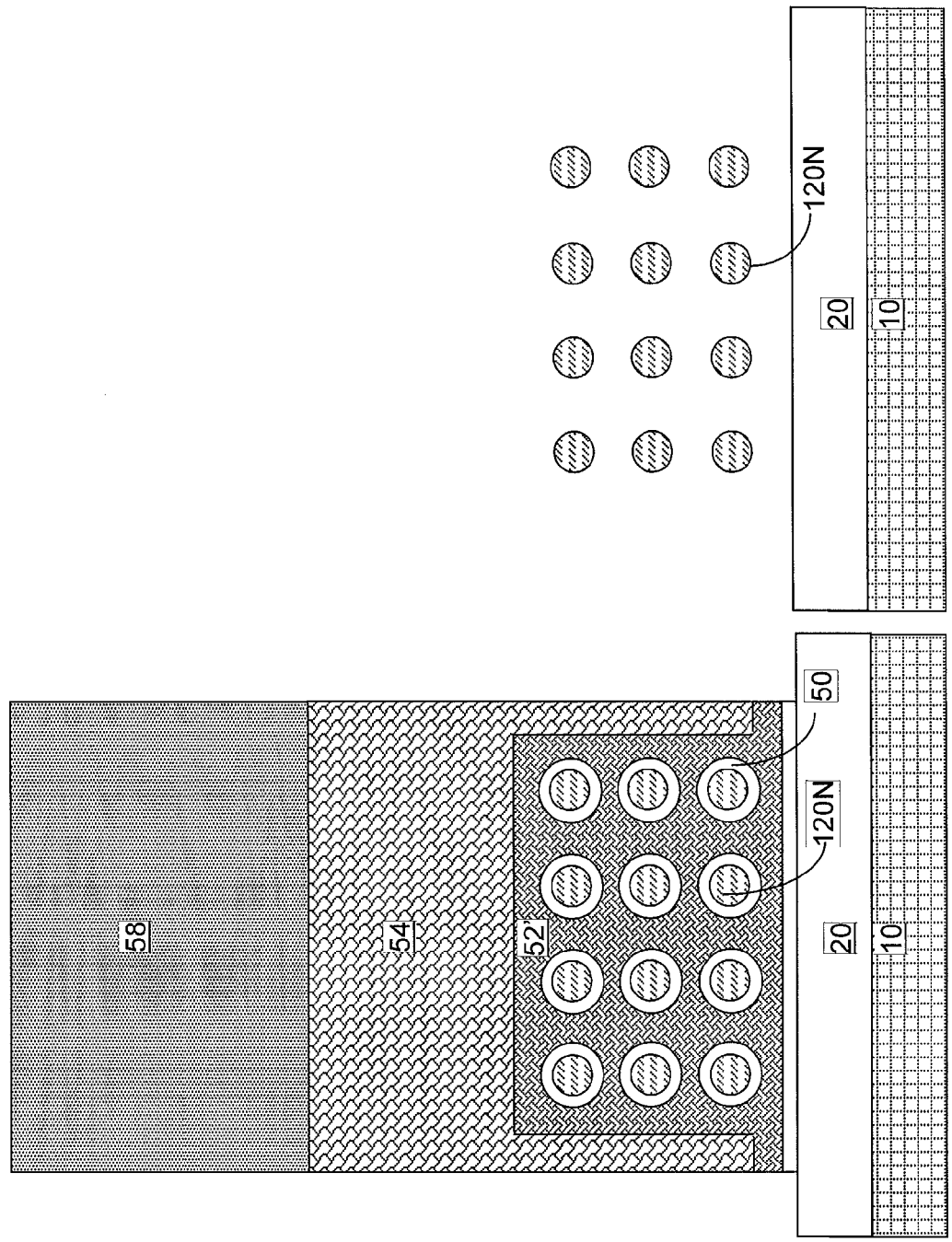

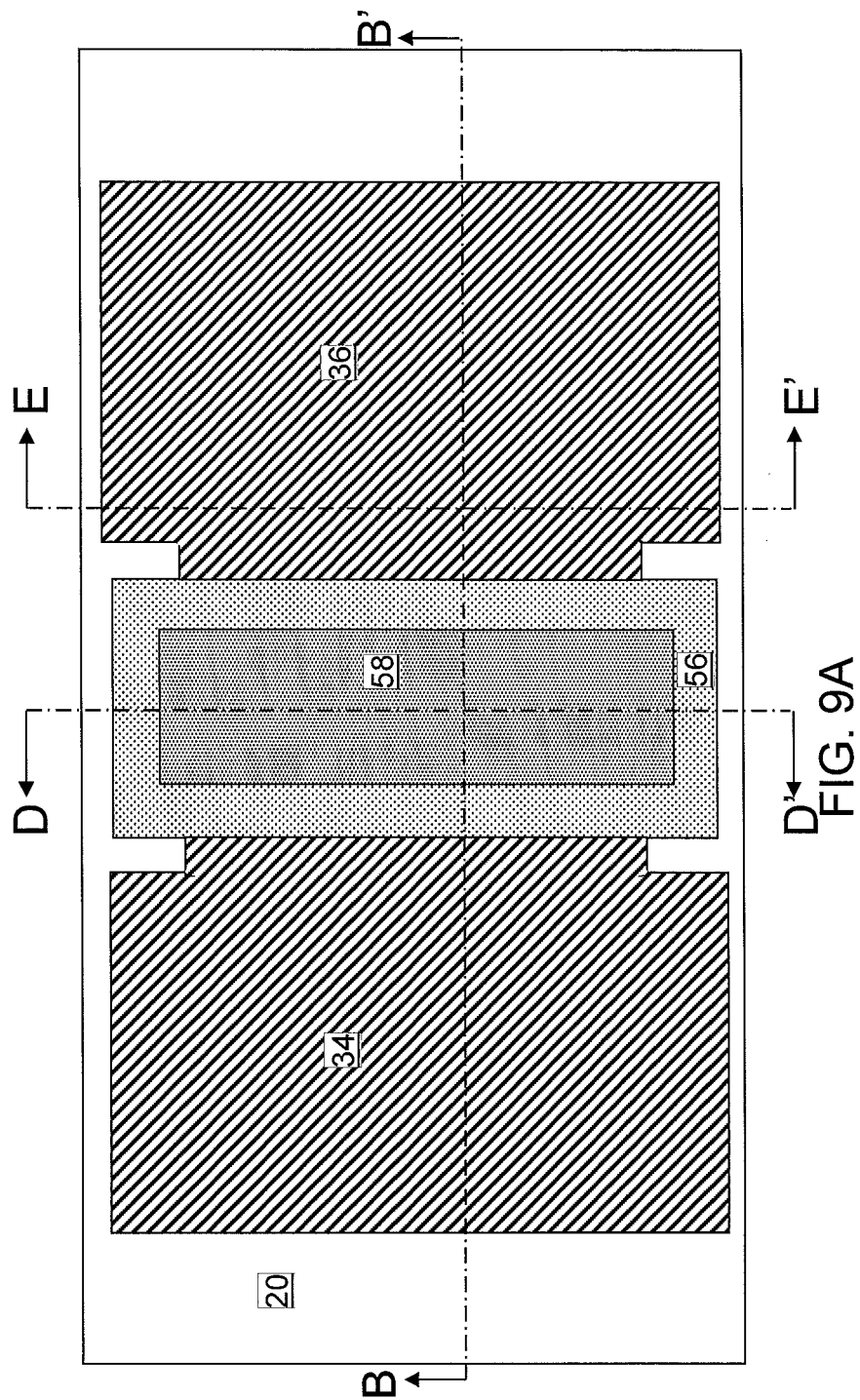

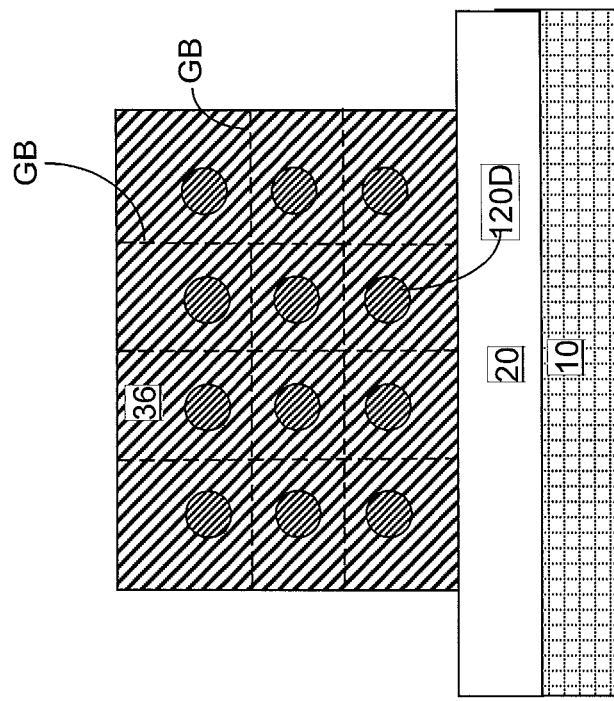
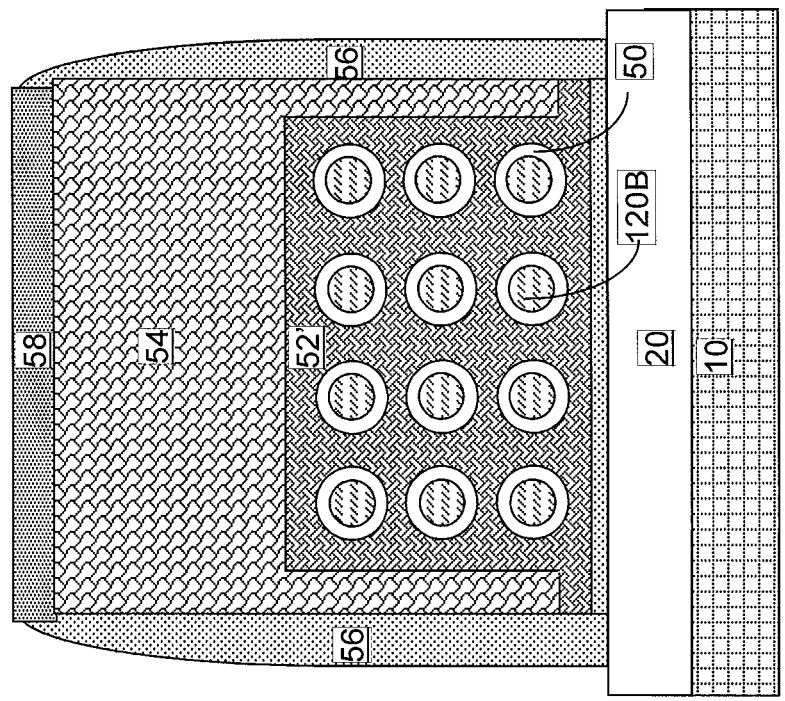
FIG. 9E
FIG. 9D

NON-REPLACEMENT GATE NANOMESH FIELD EFFECT TRANSISTOR WITH PAD REGIONS

BACKGROUND

The present disclosure relates to a semiconductor structure, and particularly to a wire-first, gate-first nanomesh field effect transistor with epitaxially thickened source and drain regions, and a method of manufacturing the same.

While nanowire field effect transistors offer the potential for scaling semiconductor devices in future generations, one of the challenges for the nanowire field effect transistors is the amount of current per unit device area. Another of the challenges for the nanowire field effect transistors is the complexity of processing steps employed to form the nanowire field effect transistors. Particularly, processing steps to form a replacement gate structure over nanowires introduce many additional processing steps, thereby increasing the processing time and the manufacturing cost for nanowire field effect transistors.

BRIEF SUMMARY

A gate-first processing scheme for forming a nanomesh field effect transistor is provided. An alternating stack of two different semiconductor materials is patterned to include two pad regions connected by nanowire regions. A semiconductor material is laterally etched selective to another semiconductor material to form a nanomesh including suspended semiconductor nanowires. A stack of a gate dielectric, a gate electrode, and a gate cap dielectric is formed over the nanomesh. A dielectric spacer is formed around the gate electrode. An isotropic etch is employed to remove dielectric materials that are formed in lateral recesses of the patterned alternating stack. A selective epitaxy process can be employed to form a source region and a drain region.

According to an aspect of the present disclosure, a method of forming a semiconductor structure is provided. An alternating stack of a first semiconductor material and a second semiconductor material is formed on a substrate. The alternating stack is patterned to form a patterned stack including a nanowire-including region, a first pad region adjoining the nanowire-including region, and a second pad region adjoining the nanowire-including region and spaced from the first pad region. The second semiconductor material is removed selective to the first semiconductor material. The nanowire-including region includes semiconductor nanowires containing the first semiconductor material and suspended between the first pad region and the second pad region, and does not include the second semiconductor material. The first and second pad regions include second semiconductor material pad portions having sidewalls that are laterally recessed from sidewalls of first semiconductor material pad portions. A gate electrode structure straddling the semiconductor nanowires is formed. A gate spacer is formed around the gate electrode structure. A raised source region and a raised drain region are formed by depositing a semiconductor material on physically exposed surfaces of the semiconductor nanowire and the first and second pad regions.

According to another aspect of the present disclosure, a semiconductor structure is provided. A vertical stack contains at least two first patterned semiconductor layers including a first semiconductor material and at least one second patterned semiconductor layer including a second semiconductor material. Each of the at least two first patterned semiconductor layers includes at least one semiconductor nanowire and a pair of first pad regions adjoining the at least one semiconductor nanowire. Each of the at least one second patterned semiconductor layer includes a pair of second pad regions that are laterally spaced from each other. A gate electrode structure straddles the semiconductor nanowires. A gate spacer laterally surrounds the gate electrode structure. A raised source region and a raised drain region include a semiconductor material and contact surfaces of the semiconductor nanowires and each of the first and second pad regions.

BRIEF DESCRIPTION OF SEVERAL VIEWS OF THE DRAWINGS

FIG. 3A is a top-down view of the exemplary semiconductor structure after lateral recessing of a second semiconductor material selective to a first semiconductor material and removal of the patterned dielectric mask structure and rounding of the semiconductor nanowires by an anneal at an elevated temperature according to an embodiment of the present disclosure.

FIG. 3D is a vertical cross-sectional view of the exemplary semiconductor structure along the vertical plane D-D' of FIG. 3A.

FIG. 5A is a top-down view of the exemplary semiconductor structure after formation of a metallic material portion, a semiconductor gate electrode, and a gate cap dielectric according to an embodiment of the present disclosure.

FIG. 5D is a vertical cross-sectional view of the exemplary semiconductor structure along the vertical plane B-B' of FIG. 5A.

FIG. 5E is a vertical cross-sectional view of the exemplary semiconductor structure along the vertical plane B-B' of FIG. 5A.

FIG. 6A is a top-down view of the exemplary semiconductor structure after a recess etch of the metallic material portion to form a metallic gate electrode according to an embodiment of the present disclosure.

FIG. 6B is a vertical cross-sectional view of the exemplary semiconductor structure along the vertical plane B-B' of FIG. 6A.

FIG. 6D is a vertical cross-sectional view of the exemplary structure along the vertical plane D-D' of FIG. 6A.

FIG. 6E is a vertical cross-sectional view of the exemplary semiconductor structure along the vertical plane E-E' of FIG. 6A.

FIG. 9A is a top-down view of the exemplary semiconductor structure after an raised source region and an raised drain region according to an embodiment of the present disclosure.

FIG. 9D is a vertical cross-sectional view of the exemplary semiconductor structure along the vertical plane D-D' of FIGS. 9A and 9B.

FIG. 9E is a vertical cross-sectional view of the exemplary semiconductor structure along the vertical plane E-E' of FIGS. 9A and 9B.

DETAILED DESCRIPTION

Figure 1:
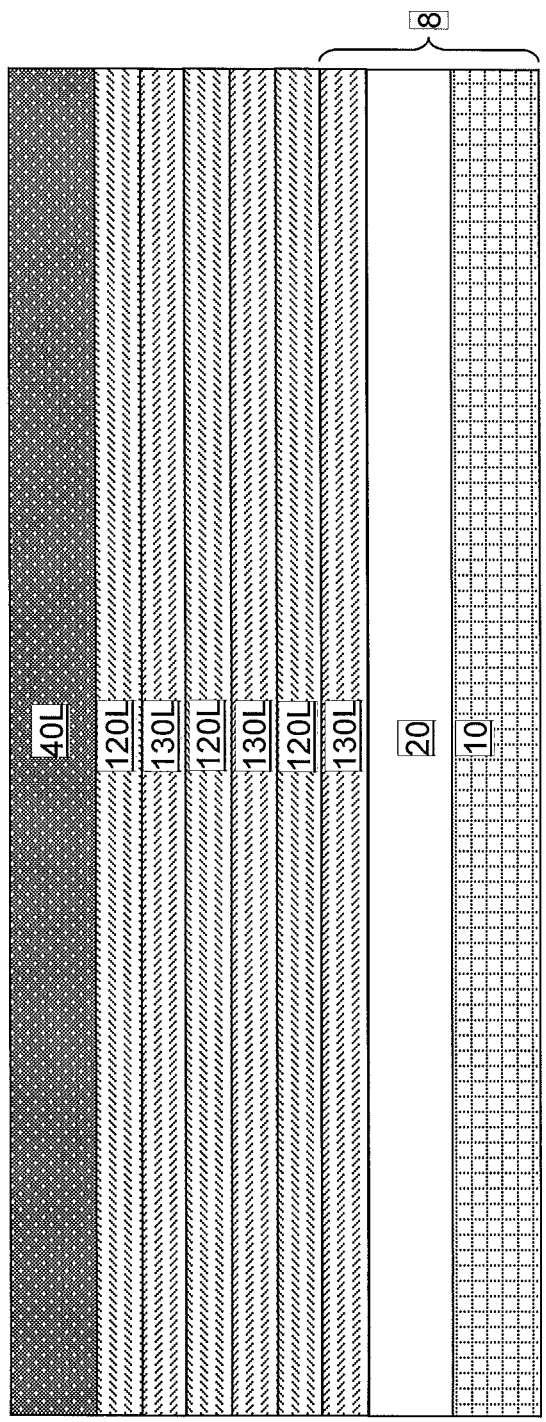
FIG. 1 is a vertical cross-sectional view of an exemplary semiconductor structure after formation of an alternating stack of a first semiconductor material and a second semiconductor material and a dielectric mask layer according to an embodiment of the present disclosure.

As stated above, the present disclosure relates to a wire-first, gate-first nanomesh field effect transistor with epitaxially thickened source and drain regions, and a method of manufacturing the same. Aspects of the present disclosure are now described in detail with accompanying figures. It is noted that like reference numerals refer to like elements across different embodiments. The drawings are not necessarily drawn to scale.

Referring to FIG. 1, an exemplary semiconductor structure according to an embodiment of the present disclosure can be formed by providing a semiconductor-on-insulator (SOI) substrate 8 including a handle substrate 10, an insulator layer 20, and a single crystalline semiconductor material layer on top of the insulator layer. The handle substrate 10 can include a semiconductor material, an insulator material, and/or a conductive material. The insulator layer 20 can include, for example, silicon oxide, silicon nitride, aluminum oxide, or any other dielectric material compatible with semiconductor processing technology. In one embodiment, the single crystalline semiconductor material layer can include a semiconductor material.

An alternating stack of the first semiconductor material and a second semiconductor material that is different from the first semiconductor material is formed. For example, the alternating stack can include first semiconductor material layers 120L and second semiconductor material layers 130L. Each of the first semiconductor material layers 120L includes a first semiconductor material, and each of the second semiconductor material layers 130L includes a second semiconductor material. Thus, an alternating stack of the first semiconductor material and the second semiconductor material is formed on a substrate (10, 20) that includes the handle substrate 10 and the buried insulator layer 20.

In one embodiment, the SOI substrate 8 as provided may include a second semiconductor material layer 130 including the second material. Alternatively, the SOI substrate 8 may be provided with a top semiconductor layer (not shown) provided directly on the top surface of the insulator layer 20, and an alternating stack having a second semiconductor material layer 130 as the bottommost layer may be formed on the top semiconductor layer. In one embodiment, the top semiconductor layer may be a single crystalline silicon layer having a thickness in a range from 10 nm to 100 nm.

In one embodiment, each first semiconductor material layer 120L can be a single crystalline semiconductor material layer. The second semiconductor material is different in composition from the first semiconductor material. Each second semiconductor material layer 130L is deposited as single crystalline semiconductor material layers in epitaxial alignment with the underlying first semiconductor material layer 120L. Thus, the entirety of the alternating stack (120L, 130L) is single crystalline, i.e., have an epitaxial alignment throughout the entirety thereof.

In one embodiment, each of the first semiconductor material and the second semiconductor material can be independently selected from elemental semiconductor materials, which include silicon, germanium, a silicon-germanium alloy, a silicon-carbon alloy, and a silicon-germanium-carbon alloy, provided that the composition of the first semiconductor material and the second semiconductor material are different, the first semiconductor material can be epitaxially deposited on the second semiconductor material and vice versa, and an etch chemistry that can remove the second semiconductor material selective to the first semiconductor material exists. As used herein, an etch chemistry that etches a first material is selective to the second material if the etch rate of the second material is less than $\frac{1}{3}$ of the etch rate of the first material. For example, an etch chemistry that includes a mixture of hydrogen peroxide and hydrofluoric acid can etch a silicon-germanium alloy having an atomic germanium concentration greater than 50% selective to silicon or a silicon-germanium alloy having an atomic germanium concentration less than 20%.

Alternately, each of the first semiconductor material and the second semiconductor material can be independently selected from compound semiconductor materials, provided that the composition of the first semiconductor material and the second semiconductor material are different, the first semiconductor material can be epitaxially deposited on the second semiconductor material and vice versa, and an etch chemistry that can remove the second semiconductor material selective to the first semiconductor material exists. In one embodiment, each of the first semiconductor material and the second semiconductor material can be independently selected from a III-V compound semiconductor material, which can be one of InSb, InP, InN, InGaSb, InGaP, InGaN, InGaAsSb, InGaAsP, InGaAsN, InGaAs, InAsSbP, InAsSb, InAs, InAlAsN, GaSb, GaP, GaN, GaInNAsSb, GaInAsSbP, GaAsSbN, GaAsSb, GaAsP, GaAsN, GaAs, BP, BN, BN, BAs, AlSb, AlP, AlN, AlInSb, AlInAsP, AlInAs, AlGaP, AlGaN, AlGaInP, AlGaAsP, AlGaAsN, AlGaAs, and AlAs.

Yet alternately, one of the first semiconductor material and the second semiconductor material can be a III-V compound semiconductor material, and the other of the first semiconductor material and the second semiconductor material can be an elemental semiconductor material or an alloy of at least two elemental semiconductor materials, provided that the composition of the first semiconductor material and the second semiconductor material are different, the first semiconductor material can be epitaxially deposited on the second semiconductor material and vice versa, and an etch chemistry that can remove the second semiconductor material selective to the first semiconductor material exists.

In a non-limiting illustrative example, the first semiconductor material can be single crystalline silicon, and the second semiconductor material can be a silicon-germanium alloy having an atomic concentration of germanium in a range from 10% to 50%.

The thicknesses of the first semiconductor material layers 120L and the second semiconductor material layers 130L are selected such that the entirety of the epitaxial alignment of the first semiconductor material layers 120L and the second semiconductor material layers 130L can be maintained throughout the entirety of the alternating stack (120L, 130L). Thus, the thickness of each of the first semiconductor material layers 120L and the second semiconductor material layers 130L is less than the critical thickness, which is the thickness at which an epitaxial material begins to lose epitaxial registry with the underlying single crystalline layer by developing dislocations.

In one embodiment, the first and second semiconductor materials can be selected such that the thicknesses of each first semiconductor material layer 120L and each second semiconductor material layer 130L can be in a range from 3 nm to 60 nm, although lesser and greater thicknesses can also be employed. In one embodiment, the thickness of the first semiconductor material layers 120L can be the same across all of the first semiconductor material layer 120L. In this case, the thicknesses of each first semiconductor material layer 120L is herein referred to as a first thickness. Additionally or alternatively, the thicknesses of the second semiconductor material layers 130L can be the same across all of the second semiconductor material layers 130L. In this case, the thickness of each second semiconductor material layer 130L is herein referred to as a second thickness.

At least two of semiconductor material layers 120L are provided within the alternating stack (120L, 130L). The upper end of the alternating stack (120L, 130L) may terminate with a first semiconductor material layer 120L or with a second semiconductor material layer 130L. Further, while the present disclosure is described employing a structure in which a first semiconductor material layer 120L is in direct contact with the insulator layer 20, embodiments are expressly contemplated herein in which a second semiconductor material layer 130L is a bottommost layer of the alternating stack (120L, 130L), and is in physical contact with the insulator layer 20. In this case, the SOI substrate 8 as provided may include a stack, from bottom to top, of the handle substrate 10, the insulator layer 20, and a second semiconductor material layer 130L including a single crystalline second semiconductor material.

The number of repletion for a pair of a first semiconductor material layer 120L and a second semiconductor material layer 130L can be 1 or greater. In one embodiment, the number of repletion for a pair of a first semiconductor material layer 120L and a second semiconductor material layer 130L can be in a range from, and including, 2 to, and including, 30. The alternating stack may terminate with a second semiconductor material layer 130L or with a first semiconductor material layer 120L.

A dielectric mask layer 40L can be deposited above the alternating stack (120L, 130L), for example, by chemical vapor deposition (CVD). The dielectric mask layer 40L can include a dielectric material such as silicon nitride, silicon oxide, silicon oxynitride, a dielectric metal oxide, a dielectric metal nitride, or a dielectric metal oxynitride. The thickness of the dielectric mask layer 40L can be from 5 nm to 100 nm, although lesser and greater thicknesses can also be employed.

Figure 2A:
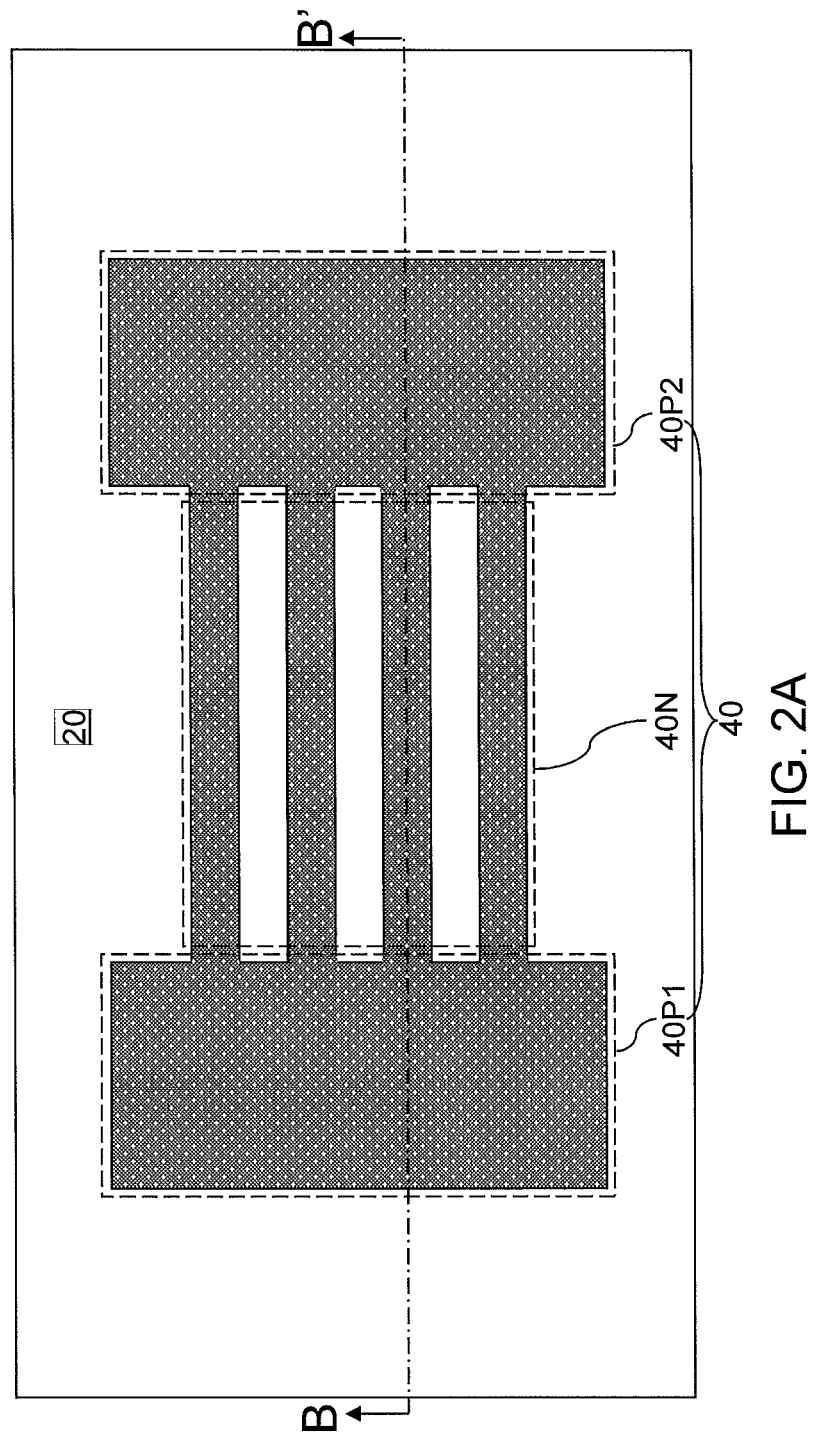
FIG. 2A is a top-down view of the exemplary semiconductor structure after formation of a patterned dielectric mask structure and a patterned semiconductor layer stack according to an embodiment of the present disclosure.
Figure 2B:
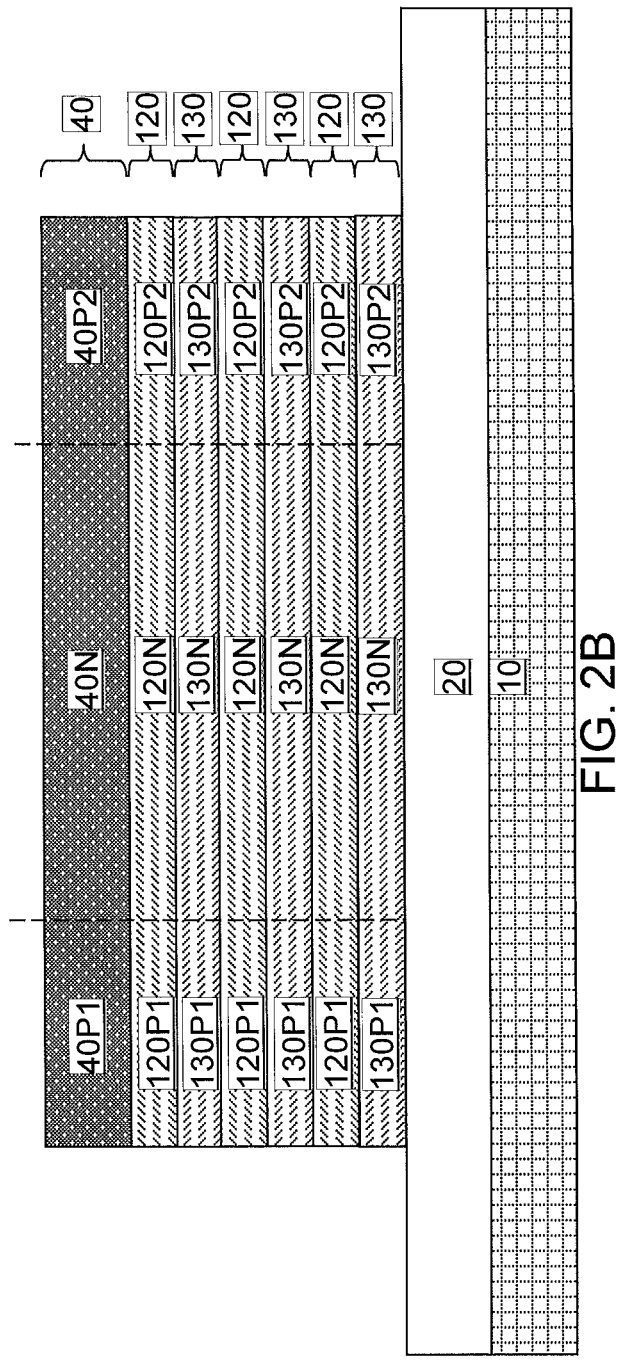
FIG. 2B is a vertical cross-sectional view of the exemplary semiconductor structure along the vertical plane B-B' of FIG. 2A.
Figure 3B:
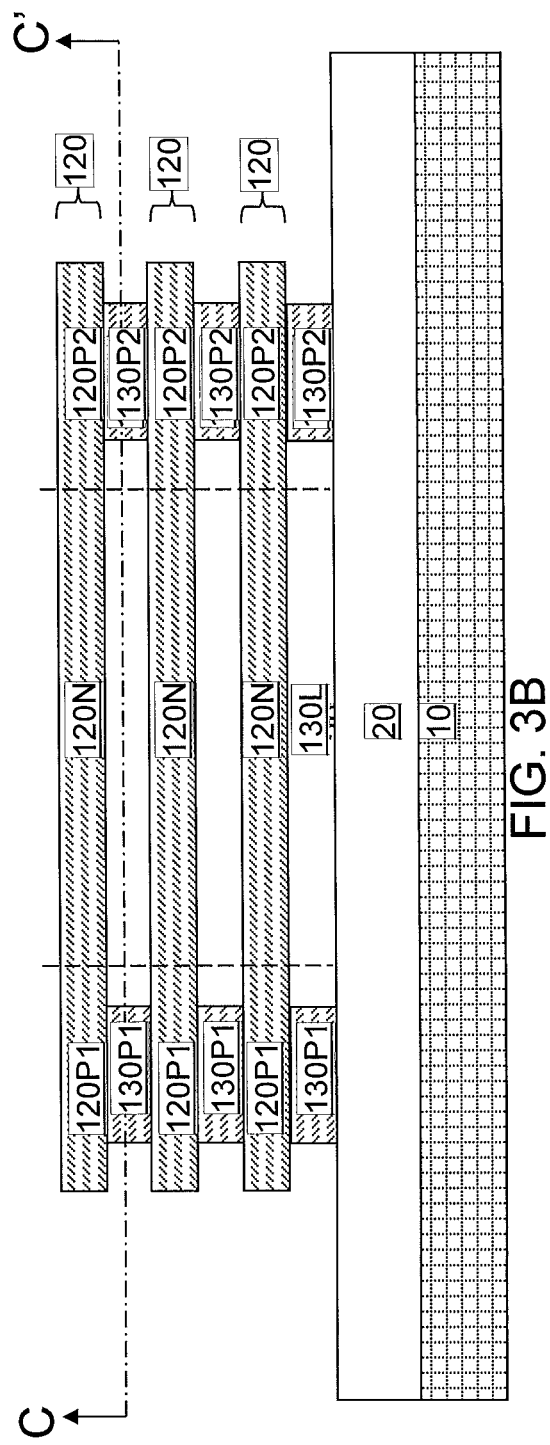
FIG. 3B is a vertical cross-sectional view of the exemplary semiconductor structure along the vertical plane B-B' of FIG. 3A.
Figure 3C:
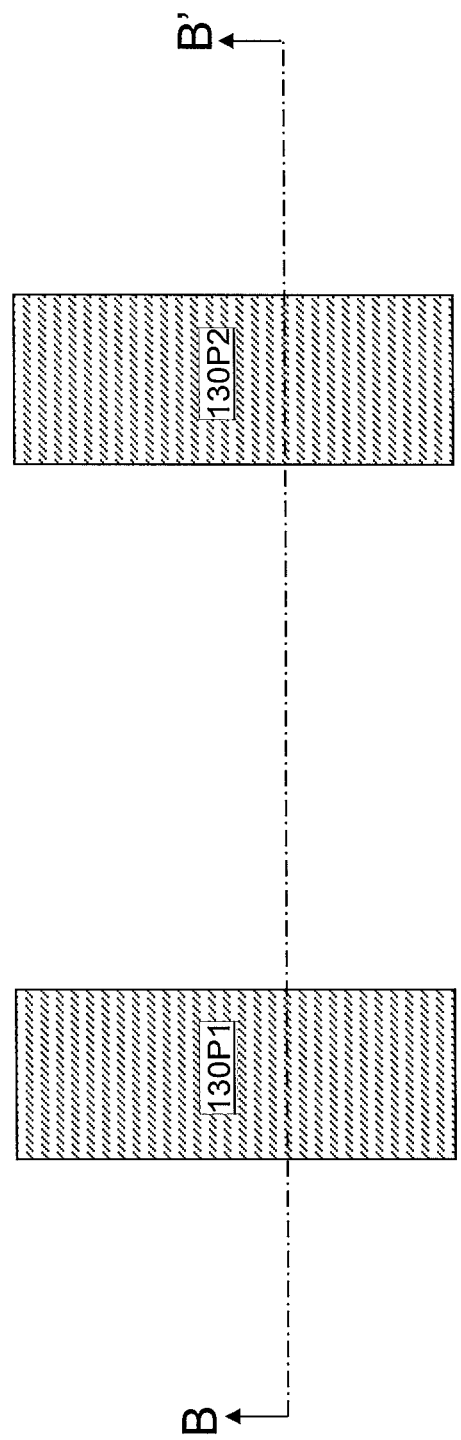
FIG. 3C is a horizontal cross-sectional view of the exemplary semiconductor structure along the horizontal plane C-C' of FIG. 3B.

Referring to FIGS. 2A and 2B, the dielectric mask layer 40L can be subsequently patterned to form a patterned dielectric mask structure 40. The patterning of the dielectric mask layer 40L into the patterned dielectric mask structure 40 can be performed, for example, by applying a photoresist layer (not shown) above the dielectric mask layer 40L, lithographically patterning the photoresist layer by lithographic exposure and development, and by transferring the pattern in the patterned photoresist layer into the dielectric mask layer 40L by an anisotropic etch that employs the patterned photoresist layer as an etch mask. The patterned photoresist layer can be subsequently removed, for example, by ashing.

The pattern in the patterned dielectric mask structure 40 is subsequently transferred through the alternating stack (120L, 130L) by an anisotropic etch that employs the patterned dielectric mask structure 40 as an etch mask. The alternating stack (120L, 130L) is thus patterned to form a patterned stack (120, 130) including patterned first semiconductor material layers 120 and at least one patterned second semiconductor material layer 130.

As seen in a top-down view, the combination of the patterned dielectric mask structure 40 and the patterned stack (120, 130) includes a nanowire-including region, a first pad region adjoining the nanowire-including region, and a second pad region adjoining the nanowire-including region and spaced from the first pad region. The portion of the patterned dielectric mask structure 40 within the nanowire-including region is herein referred to as a plurality of fin-defining dielectric structures 40N. The portion of the patterned dielectric mask structure 40 within the first pad region is herein referred to as a first dielectric pad region 40P1. The portion of the patterned dielectric mask structure 40 within the second pad region is herein referred to as a second dielectric pad region 40P2.

Referring to FIGS. 3A-3D, the second semiconductor material is removed selective to the first semiconductor material by an isotropic etch process, which can be a wet etch process or a dry etch proves. For example, if the first semiconductor material is single crystalline silicon and the second semiconductor material is a silicon-germanium alloy having an atomic concentration of germanium greater than 30%, the second semiconductor material can be removed selective to the first semiconductor material by a wet etch employing a combination of hydrogen peroxide and hydrofluoric acid.

The isotropic etch process continues until the second semiconductor material is completely removed from the nanowire-including region, i.e., from underneath the plurality of fin-defining dielectric structures 40N. The second semiconductor material is laterally recessed in each of the first pad region and the second pad region. The remaining portions of the second semiconductor material in the first and second pad regions are herein referred to as second semiconductor material pad portions. The second semiconductor material pad portions within the first pad region are herein referred to as first-pad-region second semiconductor material pad portions 130P1, and the second semiconductor material pad portions within the second pad region are herein referred to as second-pad-region second semiconductor material pad portions 130P2.

The portions of the first semiconductor material in the first and second pad regions are herein referred to as first semiconductor material pad portions. The first semiconductor material pad portions within the first pad region are herein referred to as first-pad-region first semiconductor material pad portions 120P1, and the first semiconductor material pad portions within the second pad region are herein referred to as second-pad-region first semiconductor material pad portions 130P2. The sidewalls of the second semiconductor material pad portions (130P1, 130P2) are laterally recess from the sidewalls of the overlying or underlying first semiconductor material pad portions (120P1, 120P2) by a same lateral offset distance.

The nanowire-including region includes semiconductor nanowires 120N containing the first semiconductor material. The semiconductor nanowires 120N are suspended between the first pad region and the second pad region. The nanowire-including region does not include the second semiconductor material. The first and second pad regions include second semiconductor material pad portions (130P1, 130P2) having sidewalls that are laterally recessed from sidewalls of first semiconductor material pad portions (120P1, 120P2).

The patterned dielectric mask structure 40 can be removed selective to the first semiconductor material after, or before, the isotropic etch process that removes the second semiconductor material. For example, if the patterned dielectric mask structure 40 includes silicon oxide or silicon nitride, a wet etch employing hydrofluoric acid or hot phosphoric acid may be employed to remove the patterned dielectric mask structure 40.

Each of the semiconductor nanowires 120N can have a rectangular vertical cross-sectional area along the direction perpendicular to the lengthwise direction of the semiconductor nanowires 120N. As used herein, a "lengthwise direction" of a structure refers to the direction along which the moment of inertia of the structure is minimized. The exemplary semiconductor structure can be annealed at an elevated temperature to reflow the first semiconductor material of the semiconductor nanowires 120N. For example, the exemplary semiconductor structure can be annealed at a temperature in a range from 900° C. to 1,200° C. in a hydrogen-containing environment in which the partial pressure of hydrogen in a range from 1 mTorr to 760 Torr. The duration of the anneal can be determined based on the degree of roundness of the vertical cross-sectional profile of the annealed semiconductor nanowires.

In one embodiment, the semiconductor nanowires 120N can have a cylindrical shape with a cross-sectional shape bounded by convex surfaces that extend along the lengthwise direction of the semiconductor nanowires 120N and invariant under translation along the lengthwise direction of the semiconductor nanowires 120N. In one embodiment, a vertical cross-sectional shape of each semiconductor nanowire 120N can consist of convex surfaces that extend along the lengthwise direction of the second nanowire 120N.

In one embodiment, vertical cross-sectional shapes of the annealed semiconductor nanowires 120N may be substantially circular. As used herein, a shape is substantially circular if the deviation of a shape from a circle is not greater than twice the surface roughness of the shape. In one embodiment, vertical cross-sectional shapes of the annealed semiconductor nanowires 120N may be substantially elliptical. As used herein, a shape is substantially circular if the deviation of a shape from an ellipse having an ellipticity greater than 0 (i.e., not a circle) is not greater than twice the surface roughness of the shape. The surfaces of the semiconductor nanowires 120N that extend along the lengthwise direction of the semiconductor nanowires are convex. In one embodiment, the vertical cross-sectional shape of each semiconductor nanowire 120N can be invariant under translation along the semiconductor nanowires 120N, i.e., each semiconductor nanowire 120N can have a uniform vertical cross-sectional shape within vertical planes that are perpendicular to the lengthwise direction of the semiconductor nanowires 120N that does not change with the location of the vertical cross-section. The diameter or the major axis of each semiconductor nanowire 120N, if the corresponding semiconductor nanowire is substantially circular or substantially elliptical and approximated by a circle or an ellipse, can be in a range from 5 nm to 100 nm, although lesser and greater dimensions can also be employed.

Figure 4A:
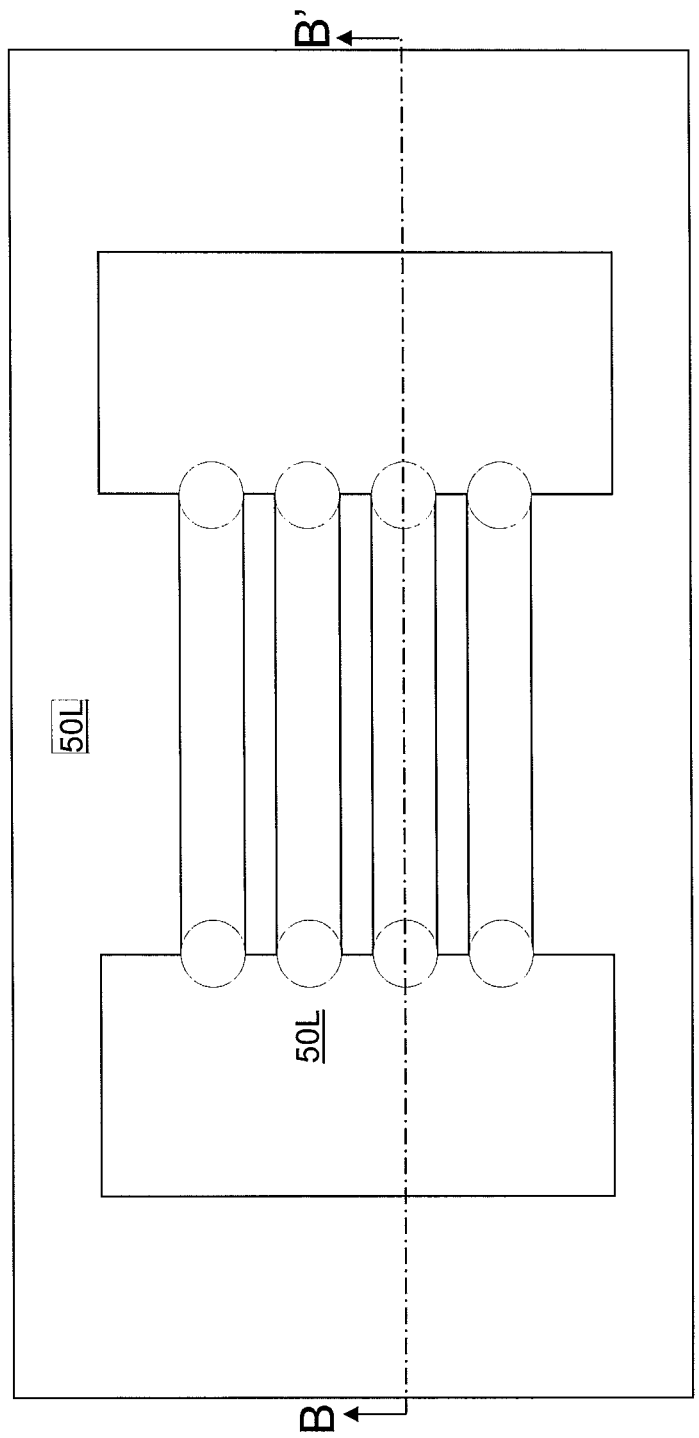
FIG. 4A is a top-down view of the exemplary semiconductor structure after formation of a gate dielectric layer according to an embodiment of the present disclosure.
Figure 4B:
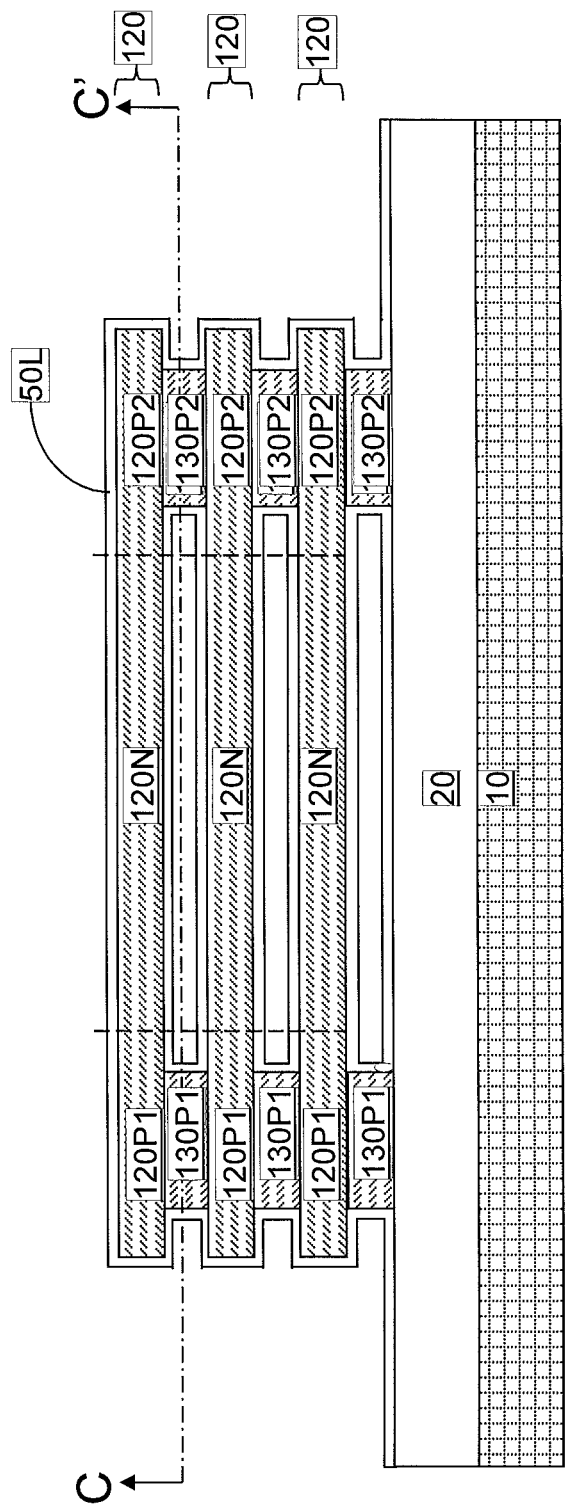
FIG. 4B is a vertical cross-sectional view of the exemplary semiconductor structure along the vertical plane B-B' of FIG. 4A.
Figure 5B:
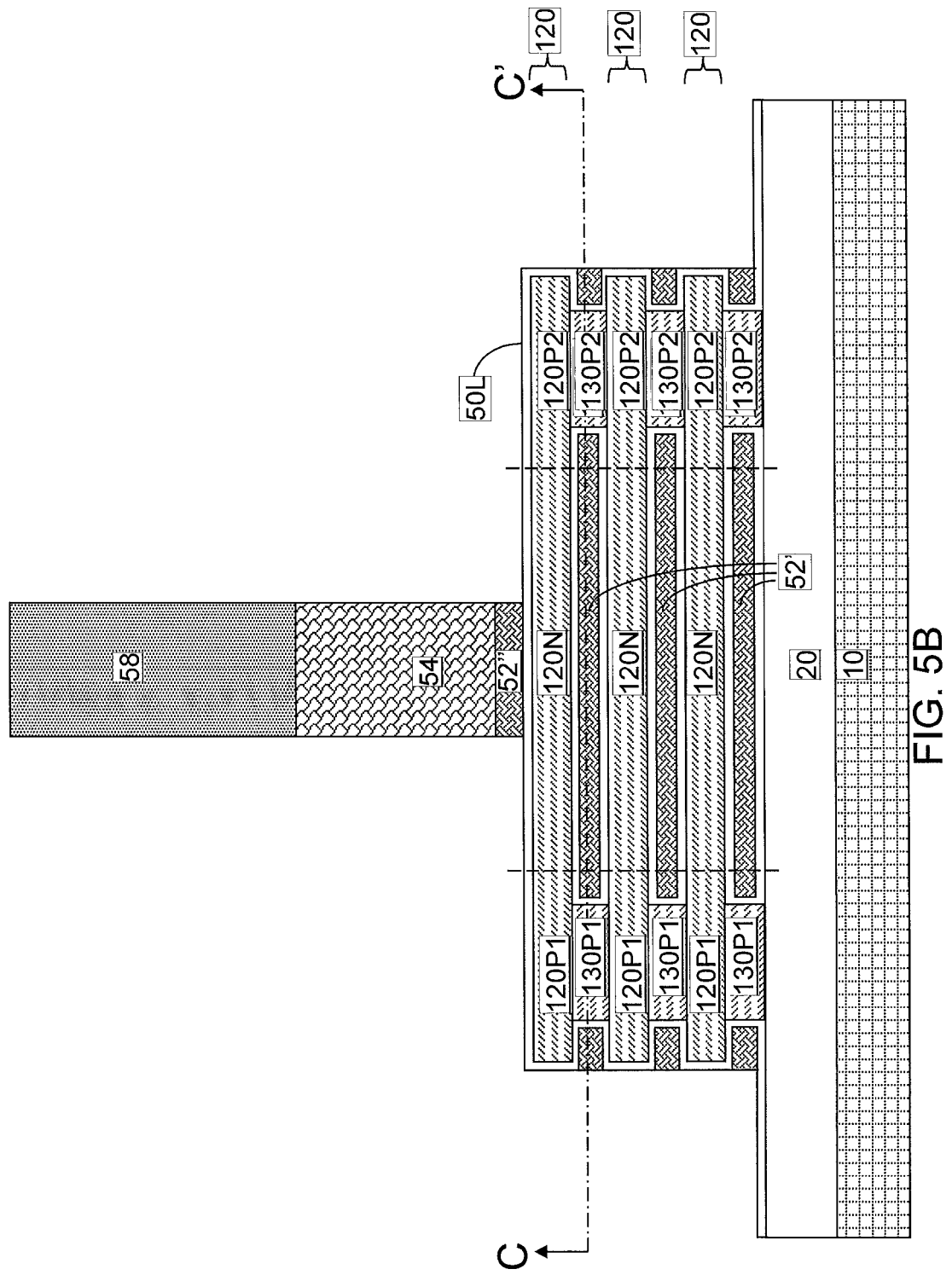
FIG. 5B is a vertical cross-sectional view of the exemplary semiconductor structure along the vertical plane B-B' of FIG. 5A.
Figure 5C:
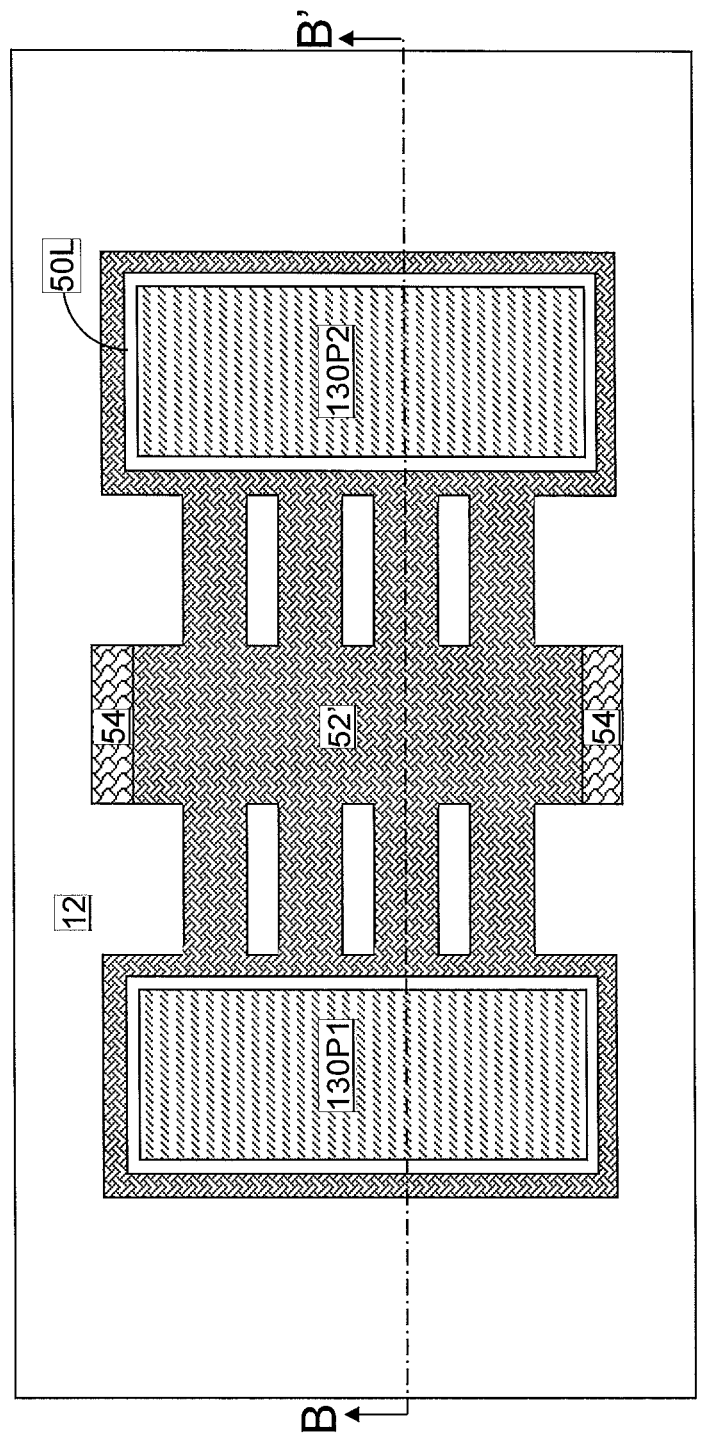
FIG. 5C is a horizontal cross-sectional view of the exemplary semiconductor structure along the vertical plane C-C' of FIG. 5B.
Figure 6C:
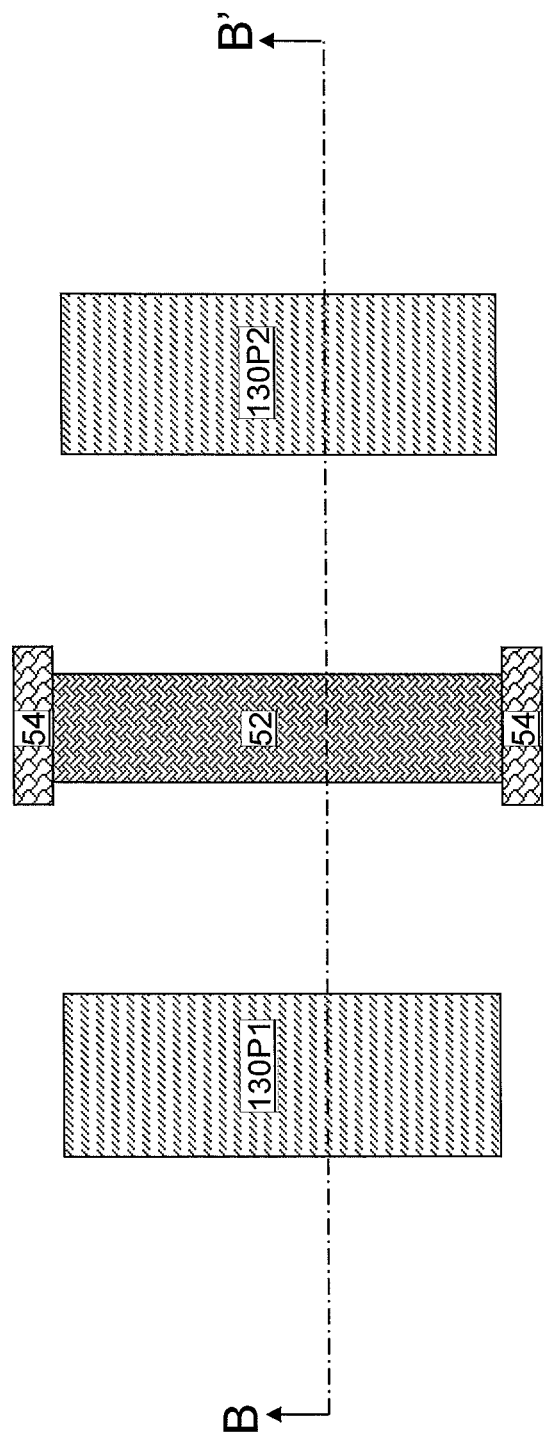
FIG. 6C is a horizontal cross-sectional view of the exemplary semiconductor structure along the vertical plane C-C' of FIG. 6B.

Referring to FIGS. 4A and 4B, a gate dielectric layer 50L is formed on the patterned stack (120, 130) including patterned first semiconductor material layers 120 and at least one patterned second semiconductor material layer 130. The gate dielectric layer 50L can be formed, for example, by atomic layer deposition (ALD), chemical vapor deposition (CVD), conversion of the physically exposed surfaces of the patterned first semiconductor material layers 120 and at least one patterned second semiconductor material layer 130 into a semiconductor-element-containing dielectric material (such as silicon oxide, silicon nitride, germanium oxide, etc.), or combinations thereof. In one embodiment, the gate dielectric layer 50L can include at least one deposited dielectric material. In this case, the gate dielectric layer 50L can include a dielectric metal oxide having a dielectric constant greater than 8.0 and commonly known in the art as a "high-k dielectric material." Alternately or additionally, the gate dielectric layer 50L can include a semiconductor-element-containing dielectric material. The gate dielectric layer 50L is formed on the semiconductor nanowires 120 and the first and second pad regions (120P1, 120P2, 130P1, 130P2). The thickness of the gate dielectric layer 50L can be in a range from 1 nm to 6 nm, although lesser and greater thicknesses can also be employed.

Referring to FIGS. 5A-5E, at least one gate electrode material layer and a gate cap dielectric layer are deposited over the patterned stack (120, 130), and is patterned to form at least one conductive material portion and a gate cap dielectric 58. In one embodiment, the at least one conductive material layer can include a stack of a metallic gate electrode material layer and a semiconductor gate electrode material layer. The metallic gate electrode material layer can include a metallic work function material for adjusting the threshold voltage of a field effect transistor to be formed. The metallic work function material can be an elemental metal, an intermetallic alloy, and/or a conductive metal compound. The metallic gate electrode material layer can be formed, for example, by chemical vapor deposition (CVD) or atomic layer deposition (ALD). The thickness of the metallic gate electrode material layer, as measured in a planar region, can be from 5 nm to 100 nm, although lesser and greater thicknesses can also be employed. The semiconductor gate electrode material layer can include a doped semiconductor material such as doped polysilicon, a doped silicon-germanium alloy, or a doped compound semiconductor material. The semiconductor gate electrode material layer can be formed, for example, by chemical vapor deposition. The thickness of the semiconductor gate electrode material layer, as measured in a planar region, can be from 50 nm to 500 nm, although lesser and greater thicknesses can also be employed. The gate cap dielectric layer includes a dielectric material layer such as silicon oxide, silicon nitride, silicon oxynitride, or a combination thereof. The thickness of the gate cap dielectric layer, as measured in a planar region, can be from 50 nm to 300 nm, although lesser and greater thicknesses can also be employed.

In one embodiment, the metallic gate electrode material layer can fill the gaps between each vertically neighboring pair of semiconductor nanowires 120N. Further, the metallic gate electrode material layer can fill the recessed region between the sidewalls of the second semiconductor material pad portions (130P1, 130P2) and vertical planes including sidewalls of the first semiconductor material pad portions (120P1, 120P2).

The material layer stack including the metallic gate electrode material layer, the semiconductor gate electrode material layer, and the gate cap dielectric layer can be patterned, for example, by applying a photoresist layer (not shown) above the top surface of the gate cap dielectric layer, patterning the photoresist layer, and transferring the pattern in the photoresist layer through the gate cap dielectric layer, the semiconductor gate electrode material layer, and the metallic gate electrode material layer. At least one anisotropic etch can be employed to transfer the pattern in the photoresist layer into the stack of the gate cap dielectric layer, the semiconductor gate electrode material layer, and the metallic gate electrode material layer. In one embodiment, the gate dielectric layer 50L may be employed as an etch stop layer for the last processing step of the at least one anisotropic etch. The photoresist layer can be subsequently removed, for example, by ashing.

A remaining portion of the gate cap dielectric layer constitutes the gate cap dielectric 58. A remaining portion of the semiconductor gate electrode material layer constitutes a semiconductor gate electrode 54, and a remaining portion of the metallic gate electrode material layer constitutes a metallic material portion 52'. A portion of the semiconductor gate electrode 54 known as gate stringers may be present outside of the area defined by photolithography due topography in the structure. The metallic material portion 52' is formed as a unitary structure, i.e., a single contiguous structure. A portion of the metallic material portion 52' is present between each vertically adjacent pair of the semiconductor nanowires 120N after the at least one anisotropic etch. The metallic material portion 52' laterally surrounds each of the second semiconductor material pad portions (130P1, 130P2) after the at least one anisotropic etch. The semiconductor gate electrode 54 is a contiguous remaining portion of the semiconductor gate electrode material layer, and overlies a portion of each of the semiconductor nanowire 120N after the at least one anisotropic etch.

Referring to FIGS. 6A-6E, one or more a recess etches are performed to laterally recess the metallic material portion 52' and any gate stringers. Specifically, gate stringer are removed with an isotropic dry etch process or an isotropic wet etch process, and the metallic material portion 52', which is a remaining portion of the metallic gate electrode material layer after the at least one anisotropic etch, is isotropically etched employing an isotropic dry etch process or an isotropic wet etch process. The material of the metallic material portion 52' is removed from regions between each vertically neighboring pair of semiconductor nanowires 120N, and from around each second semiconductor material pad portions (130P1, 130P2). Thus, the metallic gate electrode material layer and gate stringers are completely removed from regions that do not underlie the regions originally defined by photolithography. The remaining portion of the metallic material portion 52' constitutes a metallic gate electrode 52. The metallic gate electrode 52 is formed underneath the semiconductor gate electrode 54.

The metallic gate electrode 52 and the semiconductor gate electrode 54 collectively constitute a gate electrode (52, 54). The gate electrode (52, 54) laterally surrounds at least one of the semiconductor nanowires 120N. Specifically, the gate electrode (52, 54) laterally surrounds all of the semiconductor nanowires 120N that are not in physical contact with the substrate (10, 20). The sidewalls of the metallic gate electrode 52 and the semiconductor gate electrode 54 may be laterally offset from each other and from the sidewalls of the gate cap dielectric 58 after isotropically etching of the metallic material portion 52'.

The gate electrode (52, 54) and the gate cap dielectric 58 are collectively referred to as a gate electrode structure (52, 54, 58). The gate electrode structure (53, 54, 58) straddles each of the semiconductor nanowires 120N.

Figure 7A:
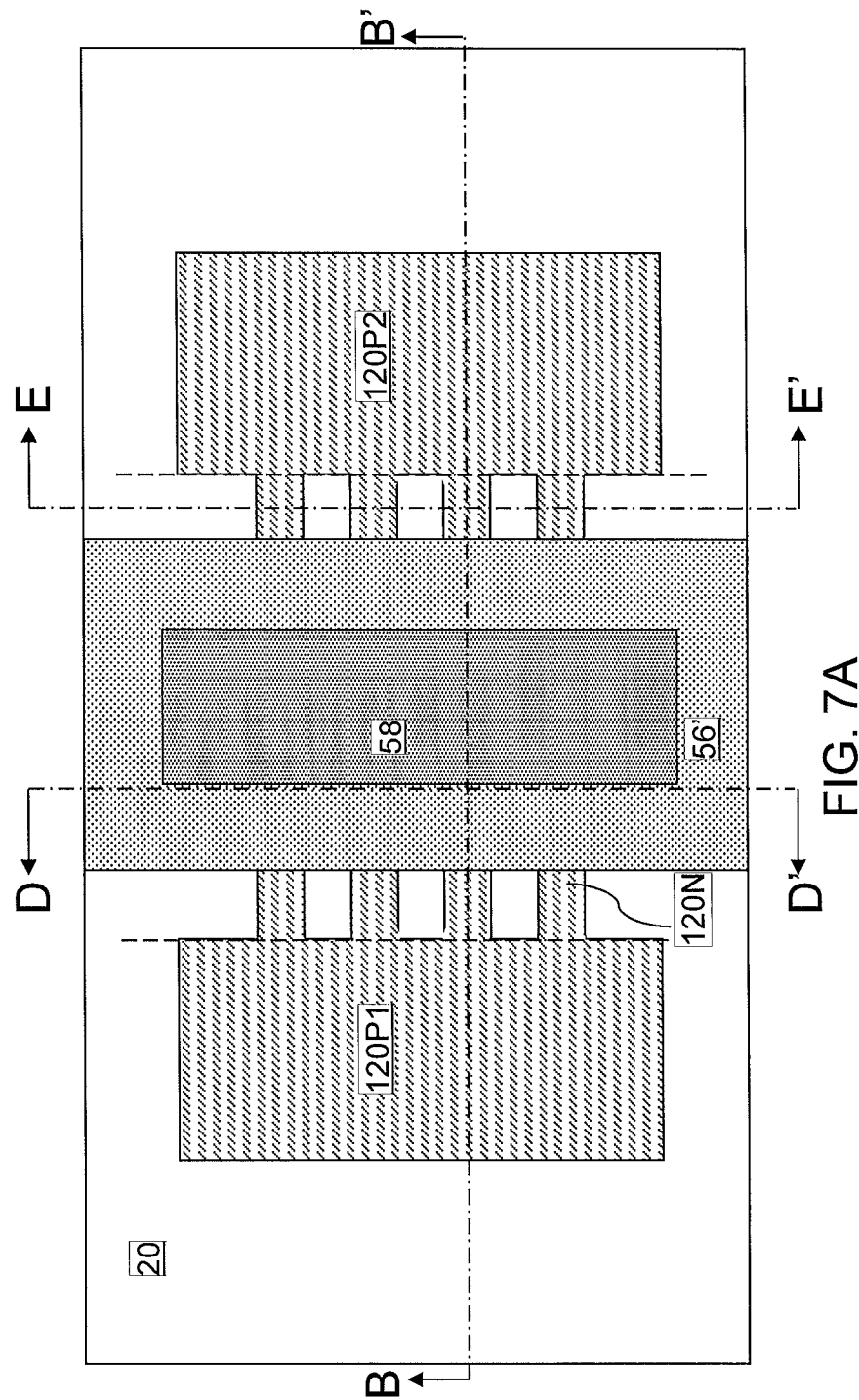
FIG. 7A is a top-down view of the exemplary semiconductor structure formation of a dielectric material portion according to an embodiment of the present disclosure.
Figure 7B:
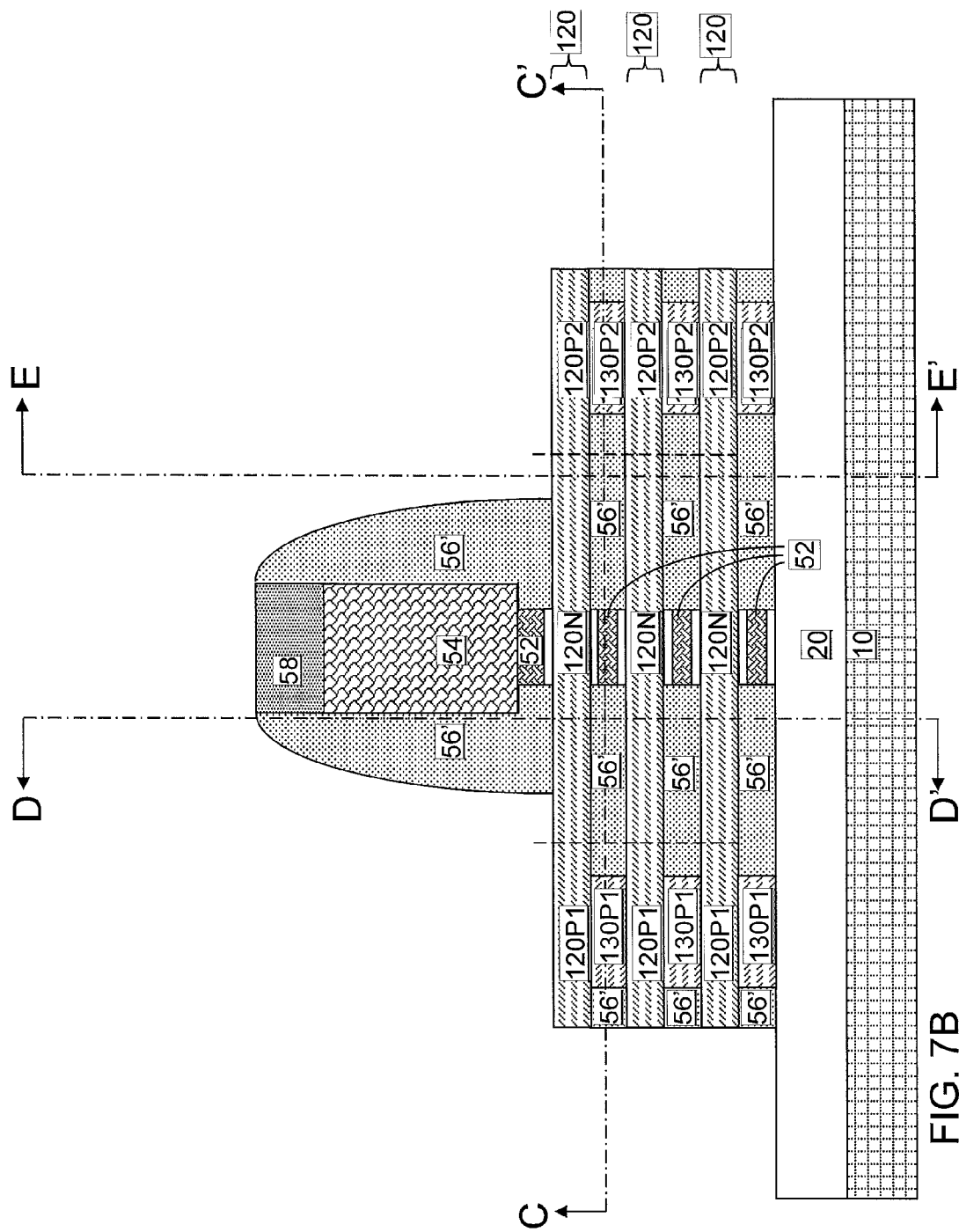
FIG. 7B is a vertical cross-sectional view of the exemplary semiconductor structure along the vertical plane B-B' of FIG. 7A.
Figure 7C:
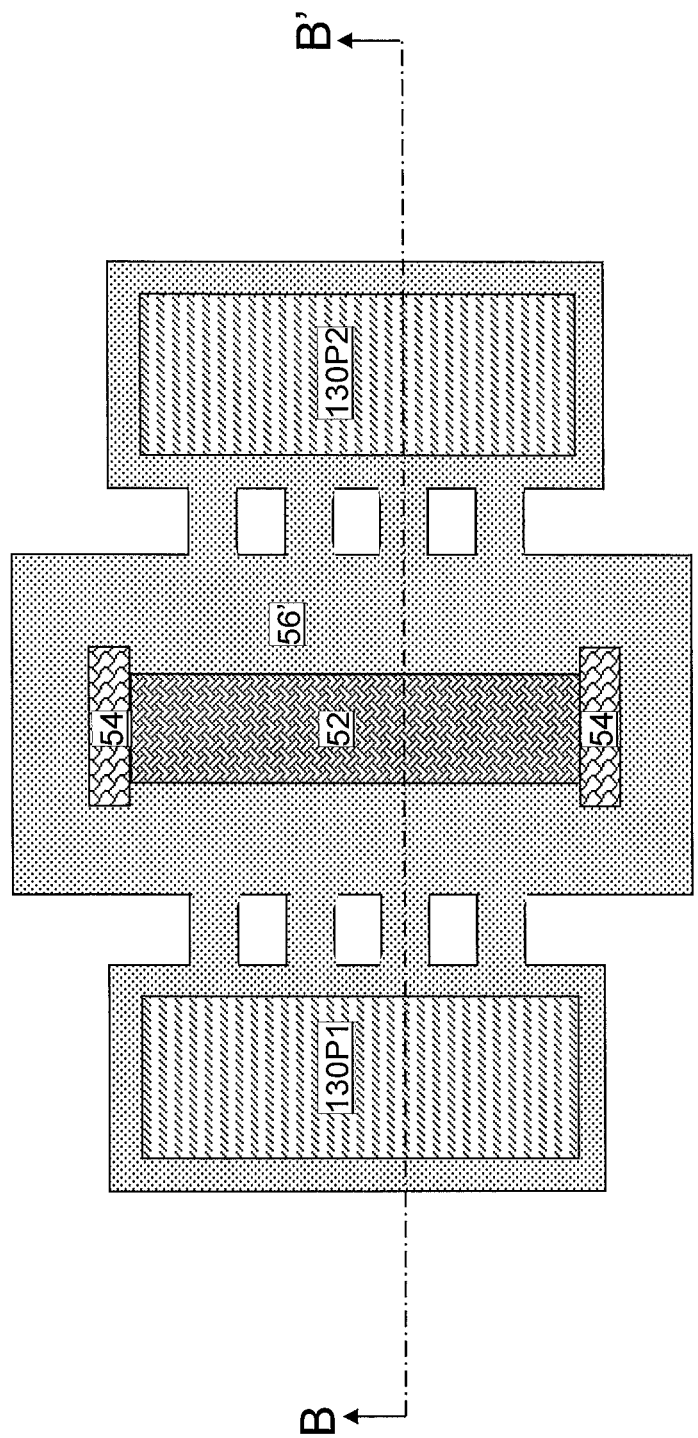
FIG. 7C is a horizontal cross-sectional view of the exemplary semiconductor structure along the horizontal plane C-C' of FIG. 7B.
Figure 7E:
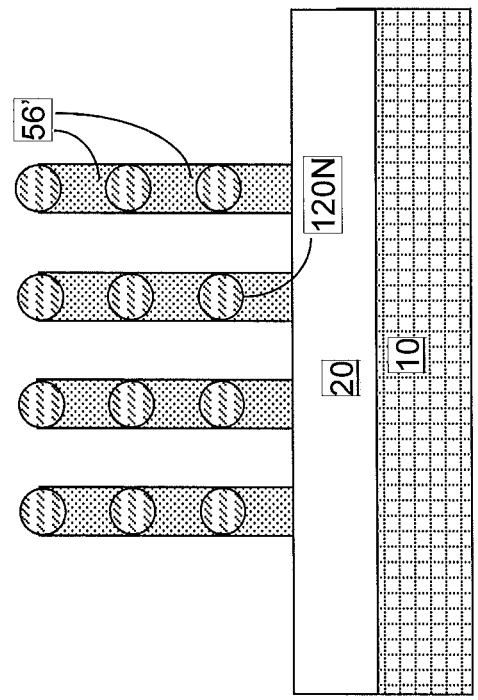
FIG. 7E is a vertical cross-sectional view of the exemplary semiconductor structure along the vertical plane E-E' of FIGS. 7A and 7B.
Figure 7D:
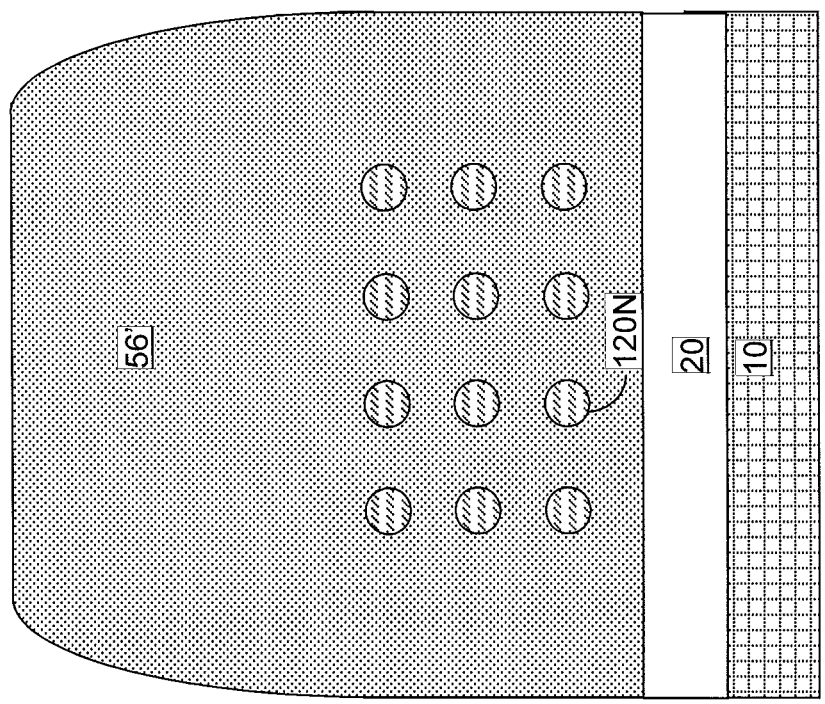
FIG. 7D is a vertical cross-sectional view of the exemplary semiconductor structure along the vertical plane D-D' of FIGS. 7A and 7B.
Figure 8A:
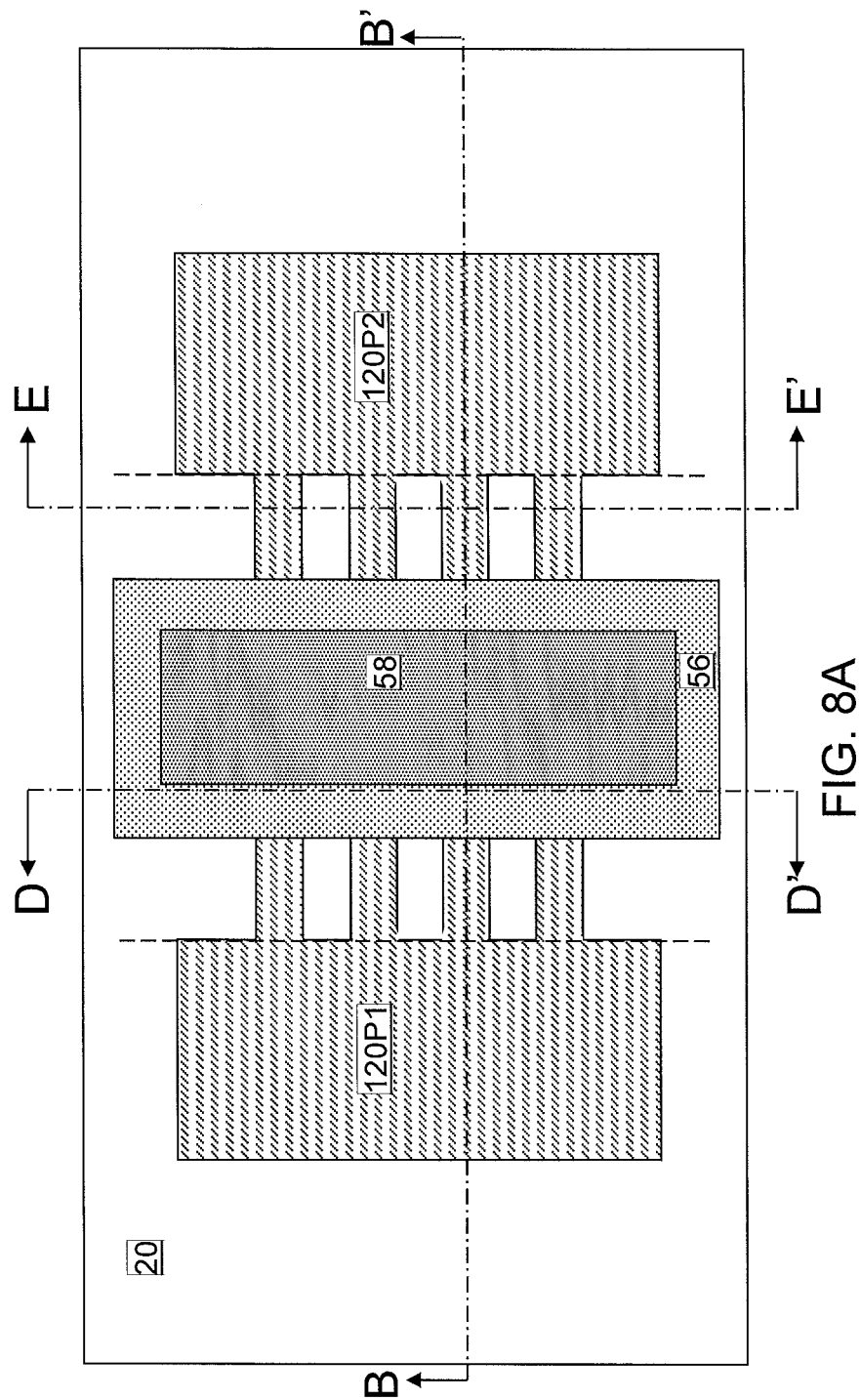
FIG. 8A is a top-down view of the exemplary semiconductor structure after formation of a gate spacer by an isotropic etch of the dielectric material portion according to an embodiment of the present disclosure.
Figure 8B:
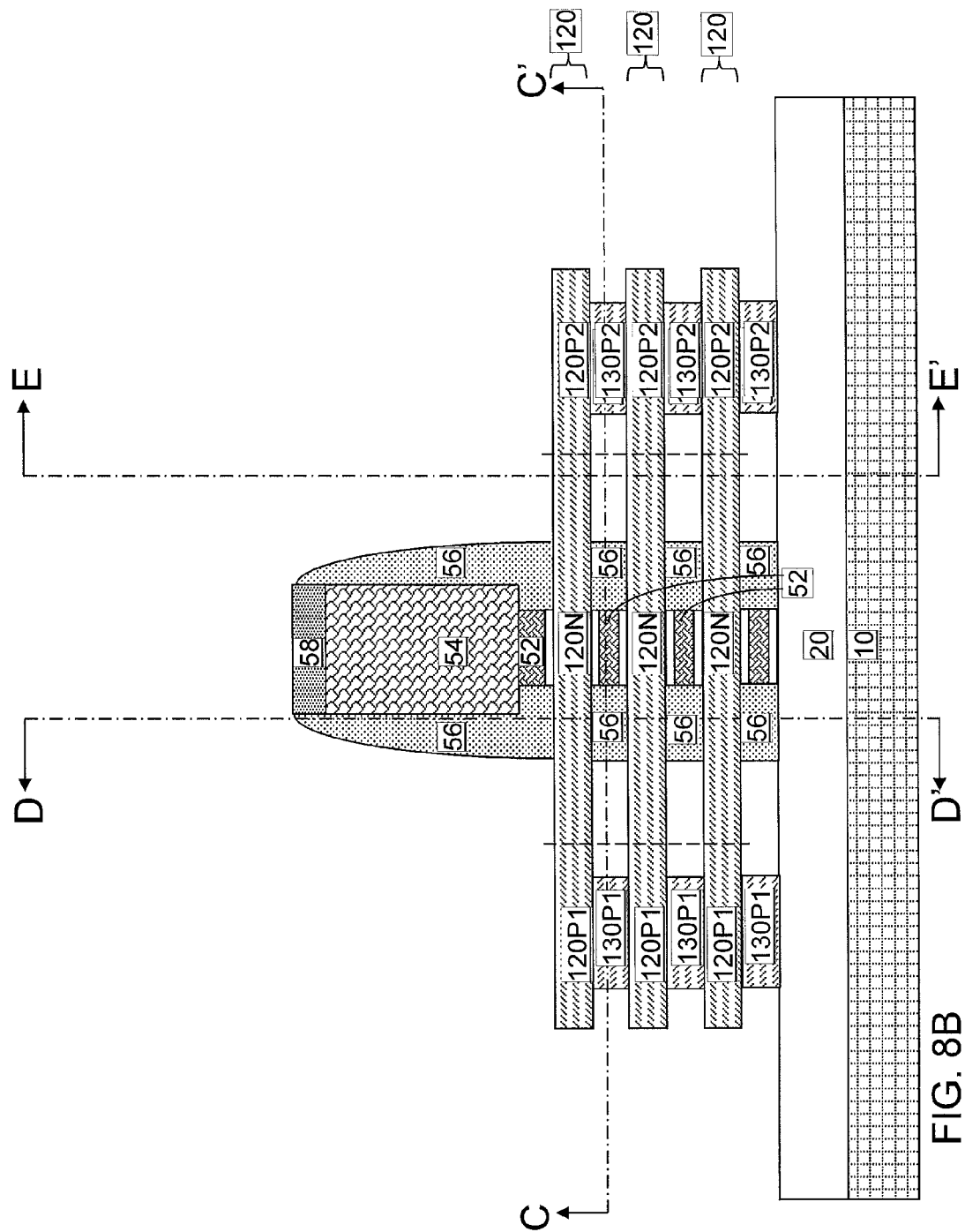
FIG. 8B is a vertical cross-sectional view of the exemplary semiconductor structure along the vertical plane B-B' of FIG. 8A.
Figure 8C:
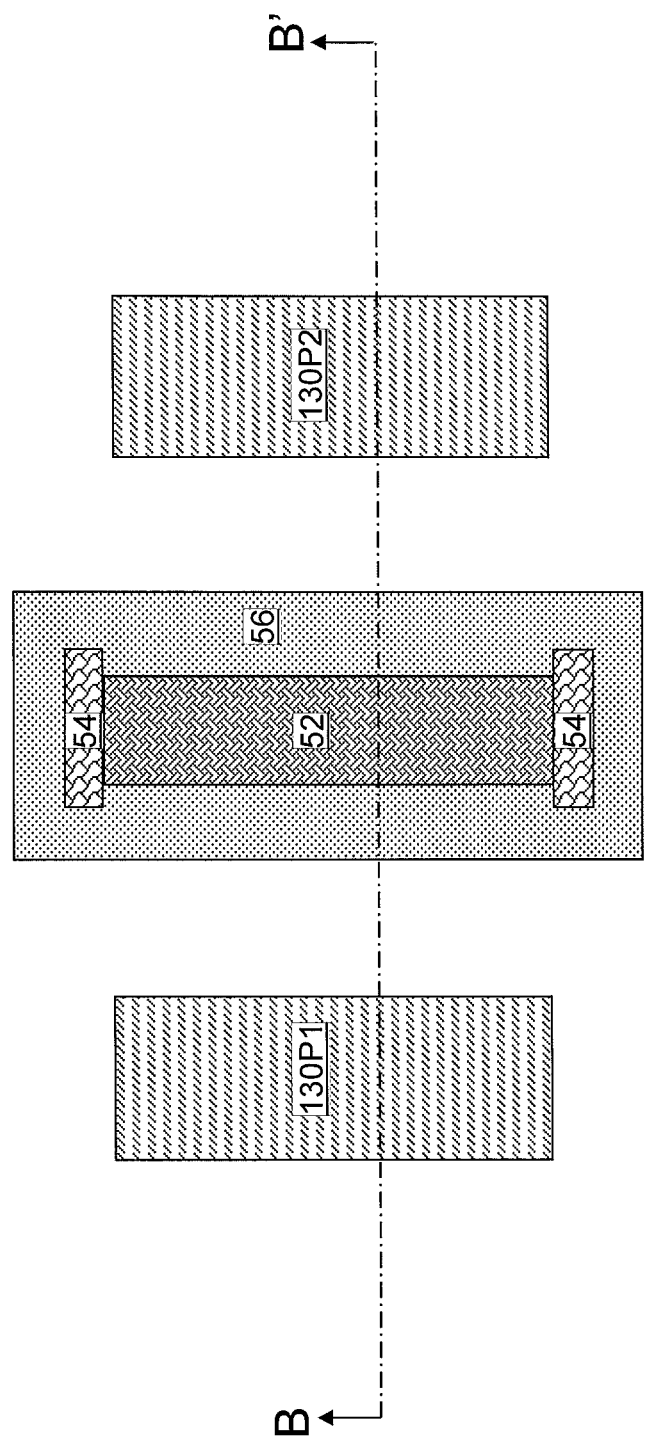
FIG. 8C is a horizontal cross-sectional view of the exemplary semiconductor structure along the horizontal plane C-C' of FIG. 8A.
Figure 8E:
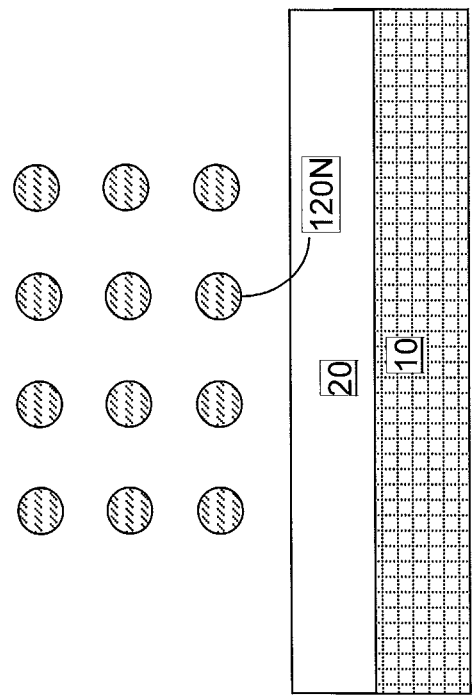
FIG. 8E is a vertical cross-sectional view of the exemplary semiconductor structure along the vertical plane E-E' of FIGS. 8A and 8B.
Figure 8D:
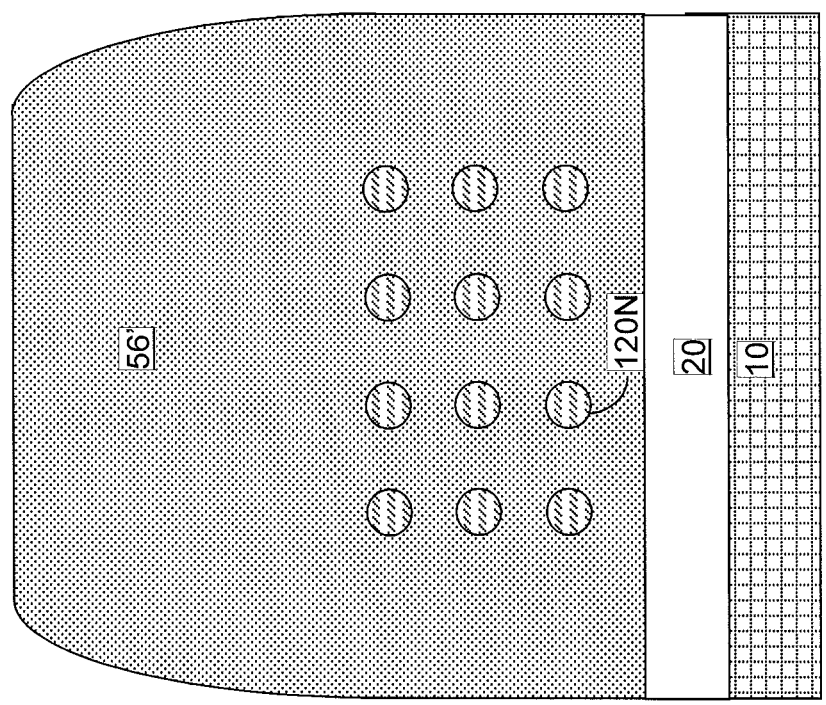
FIG. 8D is a vertical cross-sectional view of the exemplary semiconductor structure along the vertical plane D-D' of FIGS. 8A and 8B.
Figure 9B:
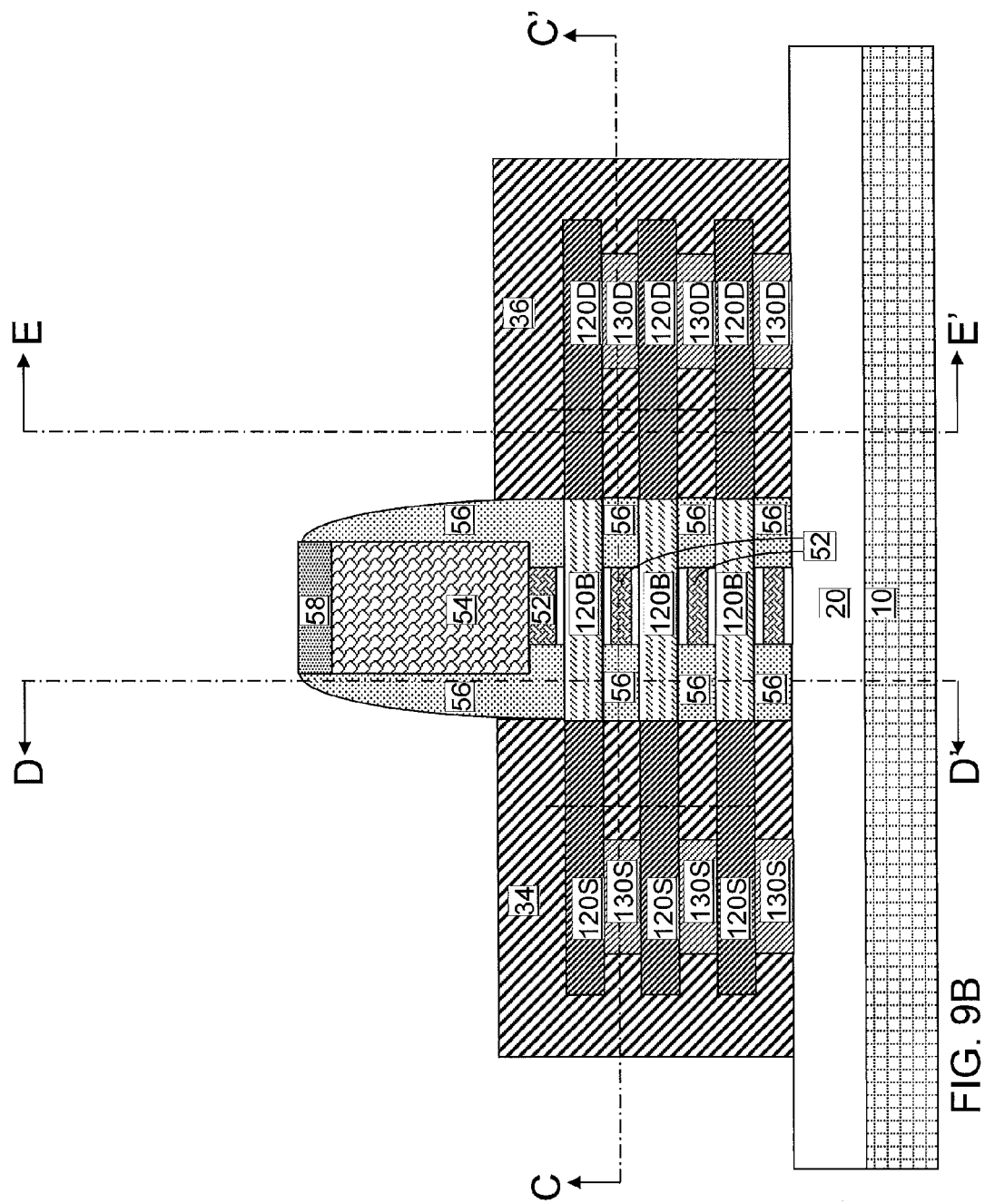
FIG. 9B is a vertical cross-sectional view of the exemplary semiconductor structure along the vertical plane B-B' of FIG. 9A.
Figure 9C:
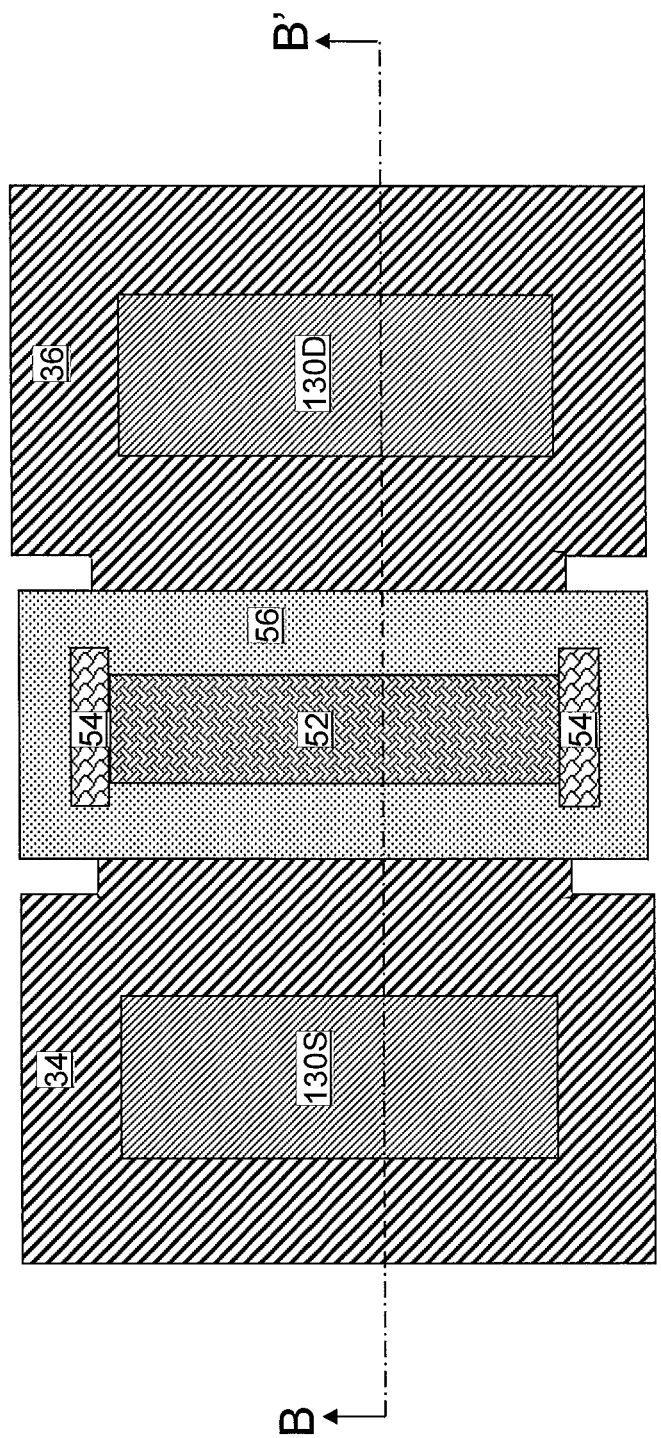
FIG. 9C is a horizontal cross-sectional view of the exemplary semiconductor structure along the horizontal plane C-C' of FIG. 9A.

In one embodiment, physically exposed portions of the gate dielectric layer 52L may be removed by an isotropic etch without etching the first and second semiconductor materials. The remaining portions of the gate dielectric layer 52L constitute gate dielectrics 52 (See FIGS. 7B, 5D, and 7E), which laterally surround portions of each semiconductor nanowire 120N. The isotropic etch can be, for example, a wet etch.

A vertical stack of at least two first patterned semiconductor layers 120 and at least one second patterned semiconductor material layer (130P1, 130P2) is thus provided. The vertical stack includes at least two first semiconductor material layer 120 and at least one second patterned semiconductor layer (130P1, 130P2) including the second semiconductor material. Each of the at least two first patterned semiconductor layers 120 includes at least one semiconductor nanowire 120N and a pair of first semiconductor material pad portions (120P1, 120P2) adjoining the at least one semiconductor nanowire 120N. Each of the at least one second patterned semiconductor layer (130P1, 130P2) includes a pair of second semiconductor material pad portions (130P1, 130P2) that are laterally spaced from each other and vertically contact at least one pair of first semiconductor material pad portions (120P1, 120P2).

The gate electrode structure (52, 54, 58) straddles the plurality of semiconductor nanowires 120N. The metallic gate electrode 52 is contact with the gate dielectrics 52, and the semiconductor gate electrode 54 is not in contact with the gate dielectrics 52. The gate electrode (52, 54) can laterally surround all of the plurality of semiconductor nanowires 120N that are not in physical contact with the substrate (10, 20).

Referring to FIGS. 7A-7E, a dielectric material layer is conformally deposited over the gate electrode structure (52, 54, 58), the semiconductor nanowires 120N, the first semiconductor material pad portions (120P1, 120P2), and the second semiconductor material pad portions (130P1, 130P2). The dielectric material layer is anisotropically etched employing an anisotropic etch process such as a reactive ion etch. A contiguous remaining portion of the dielectric material layer is formed, which is herein referred to as a contiguous dielectric material portion 56'. The contiguous dielectric material portion 56' laterally surrounds the gate electrode structure (52, 54, 58) and each of the second semiconductor material pad portions (130P1, 130P2). The contiguous dielectric material portion 56' fills gaps between vertically adjacent pairs among the semiconductor nanowires 120N.

The contiguous dielectric material portion 56' includes a dielectric material such as silicon oxide, silicon nitride, silicon oxynitride, or a combination thereof. The anisotropic etch process removes horizontal portions of the dielectric material layer selective to the semiconductor material in the topmost layer of the vertical stack (120, 130P1, 130P2), which can be the first semiconductor material. In one embodiment, an overetch is used to clear the nanowire sidewalls while collaterally etching the gate cap dielectric 58 so that the thickness of the gate cap dielectric 58 decreases during the anisotropic etch process. The remaining portions of the dielectric material layer constitute the gate spacer 56, which laterally surrounds the gate electrode structure (52, 54, 58). The entirety of the contiguous dielectric material portion 56' is a single contiguous structure. In other words, each portions of the contiguous dielectric material portion 56' is contiguously connected to any other portion of the contiguous dielectric material portion 56'.

The exemplary semiconductor structure includes a plurality of semiconductor nanowires 120N that are spaced from the top surface of a substrate (10, 20) by different distances and extending along a lengthwise direction. A plurality of gate dielectrics 50 contacts lengthwise surfaces of the plurality of semiconductor nanowires 120N that extend along the lengthwise direction. As used herein, a "lengthwise surface" of a structure is a surface that extends along the lengthwise direction of the structure. The gate electrode (52, 54) contacts the plurality of gate dielectrics 50 and laterally surrounds each semiconductor nanowire 120N that are not in contact with the substrate (10, 20) among the plurality of semiconductor nanowires 120N. The contiguous dielectric material portion 56' is in physical contact with all sidewall surfaces of the gate electrode (52, 54).

In one embodiment, the gate electrode (52, 54) can include a stack of the metallic gate electrode 52 and the semiconductor gate electrode 54. The metallic gate electrode 52 has a lesser width than the semiconductor gate electrode 54. The metallic gate electrode 52 is in contact with the plurality of gate dielectrics 50, and the semiconductor gate electrode 54 is not in contact with any gate dielectric 50.

A surface of the contiguous dielectric material portion 56' can be in physical contact with a bottom surface of the semiconductor gate electrode. The gate electrode (52, 54) laterally surrounds all of the plurality of semiconductor nanowires 120N that are not in physical contact with the substrate (10, 20).

Referring to FIGS. 8A-8E, a gate spacer 56 is formed from the contiguous dielectric material portion 56' by isotropically etching the contiguous dielectric material portion 56'. The duration of the isotropic etch can be selected such that all surfaces of the suspended nanowires become physically exposed, but gate spacer material 56 still remains along the gate sidewall. This is possible as long as the initially deposited thickness of the contiguous dielectric material portion 56' is thicker than half of the diameter of the suspended nanowires. The chemistry of the isotropic etch is selected such the first semiconductor material is not etched during the isotropic etch. In one embodiment, the chemistry of the isotropic etch can be selected such that the first and second semiconductor materials are not etched during the isotropic etch. In an illustrative example, if the contiguous dielectric material portion 56' includes silicon nitride, the isotropic etch can be a wet etch employing hot phosphoric acid. In another illustrative example, if the contiguous dielectric material portion 56' includes silicon oxide, the isotropic etch can be a wet etch employing hydrofluoric acid.

A single contiguous remaining portion of the contiguous dielectric material portion 56' after the isotropic etch constitutes the gate spacer 56. The gate spacer 56 laterally surrounds the gate electrode structure (52, 54, 58). Each vertically adjacent pair among the semiconductor nanowires 120N becomes separated by a gap in regions in which the gate spacer 56 is not present. The gate spacer 56 can be in physical contact with all sidewalls of the gate electrode (52, 54).

Referring to FIGS. 9A-9E, source regions and drain regions can be formed by doping, with electrical dopants, the first semiconductor material pad portions (120P1, 120P2), the second semiconductor material pad portions (130P1, 130P2), and the end portions of the semiconductor nanowires 120N that are not covered by the gate spacer 56 or the gate electrode structure (52, 54, 58). The source regions include first semiconductor material source regions 120S and second semiconductor material source regions 130S. The drain regions include first semiconductor material drain regions 120D and second semiconductor material drain regions 130D.

The first semiconductor material source regions 120S include all of the first-pad-region first semiconductor material pad portions 120P1 and first end portions of each semiconductor nanowire 120N. The first semiconductor material drain regions 120D include all of the second-pad-region first semiconductor material pad portions 120P2 and second end portions of each semiconductor nanowire 120N. The second semiconductor material source regions 130S include all of the first-pad-region second semiconductor material pad portions 130P1. The second semiconductor material drain regions 130D include all of the second-pad-region second semiconductor material pad portions 130P2.

The first semiconductor material source regions 120S and the first semiconductor material drain regions 120D include the first semiconductor material and the electrical dopants introduced therein. The second semiconductor material source regions 130S and the second semiconductor material drain regions 130D include the second semiconductor material and the electrical dopants introduced therein. End portions of each semiconductor nanowire 120N become incorporated into the first semiconductor material source regions 120S or the first semiconductor material drain regions 120D.

The source regions (120S, 130S) and the drain regions (120D, 130D) can be formed, for example, by ion implantation, gas phase doping, or outdiffusion from a disposable doped material such as arsenosilicate glass or borosilicate glass, of electrical dopants, which can be p-type dopants or n-type dopants. Undoped portions of the semiconductor nanowires 120N that underlie the gate electrode structure (52, 54, 58) or the gate spacer 56 constitute body regions 120B, or nanowire body regions. The body regions 120B may be intrinsic (i.e., not doped with electrical dopants), or may have a doping of the opposite conductivity type relative to the source regions (120S, 130S) and the drain regions (120D, 130D). If the body regions 120B are doped with dopants of a first conductivity type, the source regions (120S, 130S) and the drain regions (120D, 130D) are doped with dopants of a second conductivity type, which is the opposite of the first conductivity type. For example, if the body regions 120B have a p-type doping, the source regions (120S, 130S) and the drain regions (120D, 130D) can have an n-type doping, and vice versa.

A raised source region 34 and a raised drain region 36 can be formed by depositing a semiconductor material on physically exposed surfaces of the source regions (120S, 130S) and the drain regions (120D, 130D), respectively. In other words, the semiconductor material is deposited on physically exposed surfaces of the semiconductor nanowires 120N and the first and second semiconductor material pad portions (120P1, 120P2, 130P1, 130P2; See FIGS. 8A-8E). In one embodiment, selective epitaxy of a semiconductor material can be performed such that the semiconductor material is deposited only on semiconductor surfaces and does not grow from insulator surfaces. Any semiconductor selective epitaxy process known in the art can be employed. The raised source region 34 and the raised drain region 36 are doped with electrical dopants of the same conductivity type as the doping of the source regions (120S, 130S) and the drain regions (120D, 130D).

The doping of the raised source region 34 and the raised drain region 36 can be performed by in-situ doping, i.e., during deposition of the raised source region 34 and the raised drain region 36, or by ex-situ doping, i.e., after deposition of the raised source region 34 and the raised drain region 36. Exemplary methods for performing the ex-situ doping include, but are not limited to, ion implantation, plasma doping, and outdiffusion of dopants from a disposable dopant-including material that is temporarily deposited and subsequently removed.

In one embodiment, the doping of the source regions (120S, 130S) and the drain regions (120D, 130D) may be performed during, or after, formation of the raised source region 34 and the raised drain region 36. In one embodiment, the raised source region 34 and the raised drain region 36 can be formed with in-situ doping, and electrical dopants may diffuse into the source regions (120S, 130S) and the drain regions (120D, 130D) during the selective epitaxy, or after the selective epitaxy during an anneal at an elevated temperature. Alternatively or additionally, electrical dopants may be implanted after selective epitaxy of the semiconductor material of the raised source region 34 and the raised drain region 36 to dope the semiconductor materials of the raised source region 34, the raised drain region 36, the source regions (120S, 130S), and the drain regions (120D, 130D). In one embodiment, the doping of the source regions (120S, 130S) and the drain regions (120D, 130D) may be performed only during, or after, the deposition of the semiconductor material of the raised source region 34 and the raised drain region 36.

The source regions (120S, 130S) and the raised source region 34 collectively function as the source of the field effect transistor, and the drain regions (120D, 130D) and the raised drain region 36 collectively function as the drain of the field effect transistor.

In one embodiment, the plurality of semiconductor nanowires 120N can be a plurality of single crystalline semiconductor nanowires (See FIGS. 8A-8E), and the raised source region 34 and the raised drain region 36 can be formed by selective epitaxy such that the raised source region 34 and the raised drain region 36 are in epitaxial alignment with the plurality of single crystalline semiconductor nanowires.

Each of the raised source region 34 and the raised drain region 36 includes a doped semiconductor material, and is in contact with the source regions (120S, 130S) or the drain regions (120D, 130D). Each sidewall of the at least one pair of second pad regions (130S, 130D) and each sidewall of the at least two pairs of first pad regions, i.e., the pad portions of the first semiconductor material source regions 120S and the first semiconductor material drain regions 120D, are in contact with one of the raised source region 34 and the raised drain region 36.

In one embodiment, the raised source region 34 and the raised drain region 36 can differ from each of the first and second semiconductor material pad portions (120P1, 120P2, 130P1, 130P2; See FIGS. 8A-8E) by at least one of a semiconductor composition, a dopant concentration, and a dopant species.

In one embodiment, grain boundaries GB can be formed as the deposited semiconductor material that nucleates on different semiconductor nanowires 120N merge to form the raised source region 34 or the raised drain region 36. In one embodiment, each of the raised source region 34 and the raised drain region 36 can include at least one horizontal grain boundary and at least one vertical grain boundary.

Figure 10A:
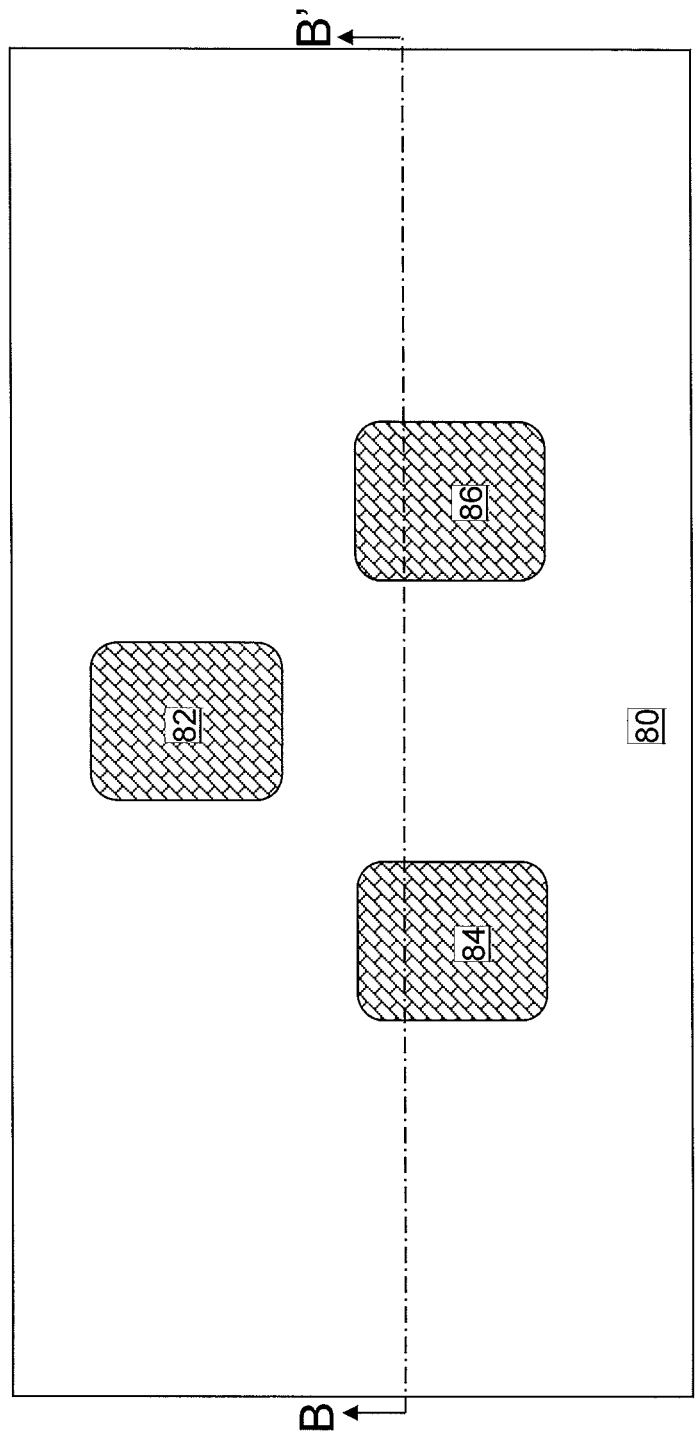
FIG. 10A is a top-down view of the exemplary semiconductor structure after formation of a contact level dielectric layer and contact via structures according to an embodiment of the present disclosure.
Figure 10B:
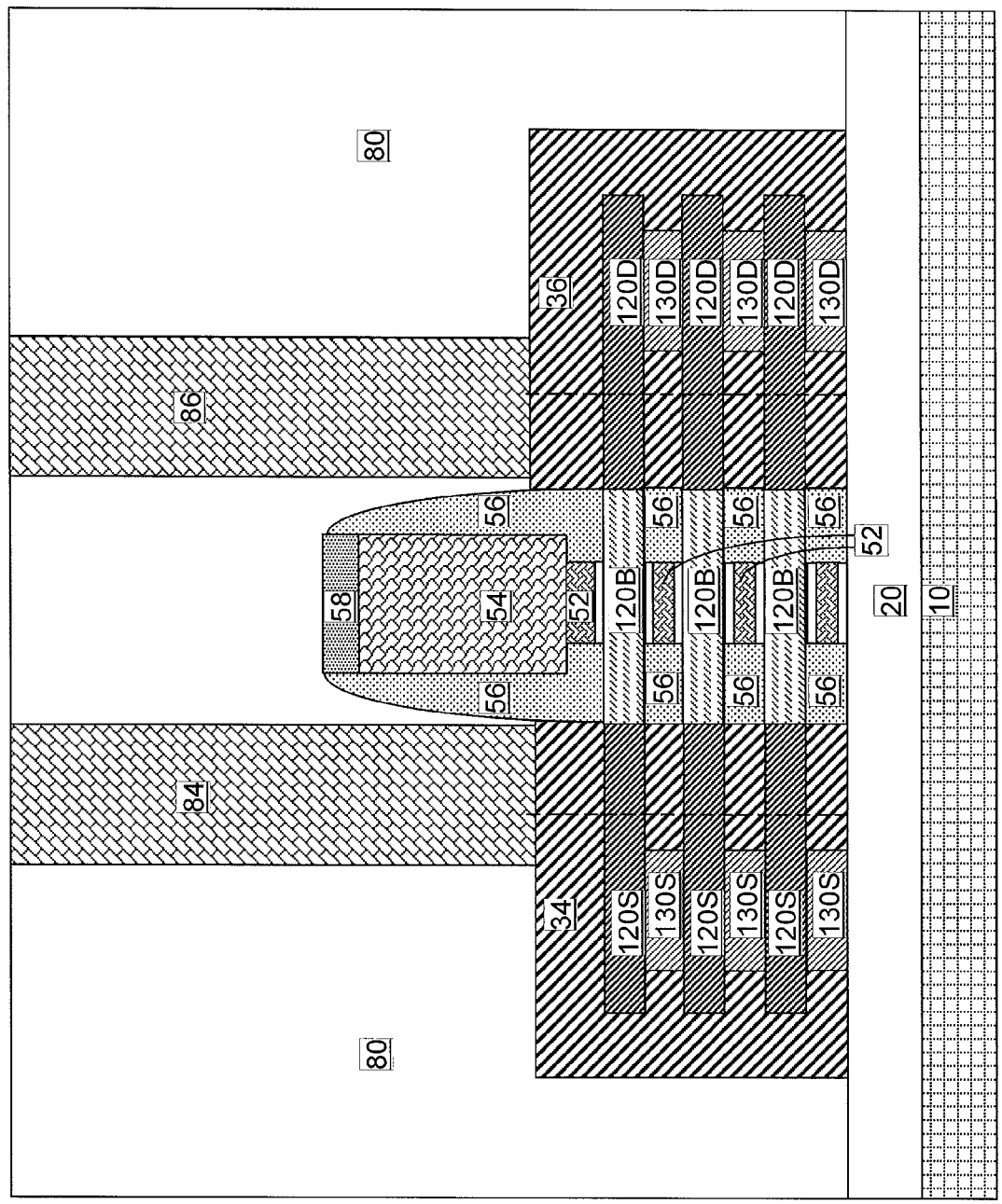
FIG. 10B is a vertical cross-sectional view of the exemplary semiconductor structure along the vertical plane B-B' of FIG. 10A.

Referring to FIGS. 10A and 10B, a contact level dielectric layer 80 and various contact via structures (82, 84, 86) can be formed to provide electrical contact to the raised source region 34, the raised drain region 36, and the gate electrode (52, 54).

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming an alternating stack of a first semiconductor material and a second semiconductor material on a substrate;
    patterning said alternating stack to form a patterned stack including a nanowire-including region, a first pad region adjoining said nanowire-including region and comprising first semiconductor material pad portions, and a second pad region adjoining said nanowire-including region and spaced from said first pad region;
    removing said second semiconductor material selective to said first semiconductor material, wherein said nanowire-including region includes semiconductor nanowires containing said first semiconductor material and suspended between said first pad region and said second pad region, and does not include said second semiconductor material, and said first and second pad regions include second semiconductor material pad portions having sidewalls that are laterally recessed from sidewalls of said first semiconductor material pad portions;
    forming a gate electrode structure straddling said semiconductor nanowires;
    forming a gate spacer around said gate electrode structure; and
    forming a raised source region and a raised drain region by depositing a semiconductor material on physically exposed surfaces of said semiconductor nanowire and said first and second pad regions.

2. The method of claim 1, further comprising forming a gate dielectric layer on said semiconductor nanowires and said first and second pad regions prior to forming said gate electrode.

3. The method of claim 2, wherein said forming of said gate electrode structure comprises:
   depositing a material layer stack including a metallic gate electrode material layer, a semiconductor gate electrode material layer, and a gate cap dielectric layer; and
   patterning said material layer stack by an anisotropic etch.

4. The method of claim 3, wherein a remaining portion of said metallic gate electrode material layer is present between each vertically adjacent pair of said semiconductor nanowires after said anisotropic etch.

5. The method of claim 4, wherein said remaining portion of said metallic gate electrode material layer laterally surrounds a pair of said second semiconductor material pad portions after said anisotropic etch.

6. The method of claim 4, wherein a contiguous remaining portion of said semiconductor gate electrode material layer overlies a portion of each of said semiconductor nanowire after said anisotropic etch.

7. The method of claim 4, further comprising isotropically etching said remaining portion of said metallic gate electrode material layer after said anisotropic etch, wherein a metallic gate electrode is formed underneath a remaining portion of said semiconductor gate electrode material layer, and said metallic gate electrode material layer is removed from regions that do not underlie said remaining portion of said semiconductor gate electrode layer.

8. The method of claim 7, wherein sidewalls of said metallic gate electrode is laterally offset from sidewalls of said remaining portion of said semiconductor gate electrode material layer after said isotropically etching of said remaining portion of said metallic gate electrode material layer.

9. The method of claim 1, further comprising
   conformally depositing a dielectric material layer over said gate electrode structure, said semiconductor nanowires, and said first and second pad regions; and
   anisotropically etching said dielectric material layer, wherein a contiguous remaining portion of said dielectric material layer laterally surrounds said gate electrode structure and each of said second semiconductor material pad portions.

10. The method of claim 9, wherein said contiguous remaining portion of said dielectric material layer fills gaps between vertically adjacent pairs among said semiconductor nanowires.

11. The method of claim 10, further comprising isotropically etching said contiguous remaining portion of said dielectric material layer after said anisotropically etching of said dielectric material layer to form a gate spacer, wherein all sidewalls of said second semiconductor material pad portions become physically exposed after said formation of said gate spacer.

12. The method of claim 11, wherein each vertically adjacent pair among said semiconductor nanowires becomes separated by a gap in regions in which said gate spacer is not present.

13. The method of claim 1, wherein said gate electrode laterally surrounds all of said semiconductor nanowires that are not in physical contact with said substrate.

14. The method of claim 1, wherein said raised source region and said raised drain region differs from each of said first and second semiconductor material pad portions by at least one of a semiconductor composition, a dopant concentration, and a dopant species.

15. The method of claim 1, wherein said raised source region and said raised drain region are formed by performing selective epitaxy of a semiconductor material, wherein said semiconductor material is deposited only on semiconductor surfaces and does not grow from insulator surfaces.

* * * * *